(12) United States Patent
Fu et al.

(10) Patent No.: US 12,665,177 B2
(45) Date of Patent: Jun. 23, 2026

(54) VIBRATION DAMPING AND RESONANCE REDUCTION FOR ION PUMP

(71) Applicant: ASML Netherlands B.V., Veldhoven (NL)

(72) Inventors: Chenxi Fu, San Jose, CA (US); Long Di, San Jose, CA (US); Lucas Kuindersma, Eindhoven (NL); Kuo-Feng Tseng, San Jose, CA (US); Peter Paul Hempenius, San Jose, CA (US); Yu Liu, San Jose, CA (US); Ying Luo, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 841 days.

(21) Appl. No.: 17/798,061

(22) PCT Filed: Feb. 4, 2021

(86) PCT No.: PCT/EP2021/052705
§ 371 (c)(1),
(2) Date: Aug. 5, 2022

(87) PCT Pub. No.: WO2021/156387
PCT Pub. Date: Aug. 12, 2021

(65) Prior Publication Data
US 2023/0114067 A1    Apr. 13, 2023

Related U.S. Application Data

(60) Provisional application No. 63/011,907, filed on Apr. 17, 2020, provisional application No. 62/971,111, filed on Feb. 6, 2020.

(51) Int. Cl.
*H01J 41/12* (2006.01)
*F04B 37/02* (2006.01)
*H01J 37/28* (2006.01)

(52) U.S. Cl.
CPC .............. *H01J 41/12* (2013.01); *F04B 37/02* (2013.01); *H01J 37/28* (2013.01)

(58) Field of Classification Search
CPC . H01J 41/12; H01J 41/20; F04B 37/02; F04B 37/14
See application file for complete search history.

(56) References Cited

U.S. PATENT DOCUMENTS 3,163,041 A * 12/1964 Henning .............. H02K 49/102
310/104
9,695,806 B2    7/2017  Van Brunt et al.
(Continued)

FOREIGN PATENT DOCUMENTS

CN        1673550 A     9/2005
CN      102928080 A     2/2013
(Continued)

OTHER PUBLICATIONS

Stiffness, by Wikipedia.org, published Dec. 2019 (URL: https://en.wikipedia.org/w/index.php?title=Stiffness&oldid=930727774) (Year: 2019).*
(Continued)

*Primary Examiner* — Thomas Fink
(74) *Attorney, Agent, or Firm* — Finnegan, Henderson, Farabow, Garrett & Dunner, LLP

(57) ABSTRACT

Apparatuses and systems for damping vibration of a vacuum vessel mounted with a pump include a pump body and a damping element coupled to the pump body, wherein the pump body and the damping element form a mass-based damper, and wherein the pump body forms a mass component of the mass-based damper; and the damping element forms a damping component of the mass-based damper. The apparatuses and systems also include a pump body configured to be secured to a column of a charged-particle inspection apparatus, a sensor coupled to the pump body, an
(Continued)

actuator coupled to the pump body, and a circuitry communicatively coupled to the sensor and the actuator for receiving motion data indicative of a vibration of the column; determining a damping based on the motion data; and actuate the actuator to react to the vibration of the column in accordance with the damping.

15 Claims, 16 Drawing Sheets

(56)                    References Cited

U.S. PATENT DOCUMENTS

| | | | |
|---|---|---|---|
| 10,568,980 | B2 | 2/2020 | Noda et al. |
| 11,008,911 | B1 * | 5/2021 | Hannula .................... F01N 3/04 |
| 2012/0091362 | A1 | 4/2012 | Tsuji et al. |
| 2012/0193550 | A1 * | 8/2012 | Tsuji ......................... F16F 1/50 |
| | | | 250/396 R |
| 2017/0213683 | A1 * | 7/2017 | Myneni ..................... H01J 1/50 |

FOREIGN PATENT DOCUMENTS

| | | |
|---|---|---|
| CN | 104282516 A | 1/2015 |
| EP | 1635086 B1 | 5/2007 |
| JP | 2003-242919 A | 8/2003 |
| JP | 3926169 B2 | 6/2007 |
| JP | 2008052947 A | 3/2008 |
| KR | 2019-0008060 A | 1/2019 |
| TW | M409340 U | 8/2011 |

OTHER PUBLICATIONS

Natural Frequency, by Wikipedia.org, published Jan. 2020 (URL: https://en.wikipedia.org/w/index.php?title=Natural_frequency&oldid=935960694) (Year: 2020).*

Office Action of the Intellectual Property Office of Taiwan issued in related Taiwanese Patent Application No. 110103943; mailed Oct. 7, 2022 (15 pgs.).

International Search Report and Written Opinion received from the International Search Authority issued in related International Application No. PCT/EP2021/052705 mailed Apr. 29, 2021 (3 pgs.).

Agilent Ion Pumps Catalog, https://www.agilent.com/es/library/catalog/public/06_ion_Pumps.pdf, Dec. 8, 2014, XP055468082 (53 pgs.).

Flanges and Fittings Excerpt from the Oerlikon Leybold Vacuum Full Line Catalog 2015/2016, Catalog Part Flanges and Fittings (76 pgs.).

https://www.leyboldproducts.com/media/pdf/8e/e6/3f/CP_080_Fittings_EN57bed2d4b36d0.pdf, Jan. 1, 2015, XP055796180, p. 869 (1 pg.).

* cited by examiner

100

110

106

110

100

112

104

120

106

116

110

120

108

118

116

114

100

112

Ion Pump Part
122

Flange 106

Pipe 108

Wall 110

Pump Body
114

126

Ion Pump Part
124

Magnet Sets

Machine 102

300
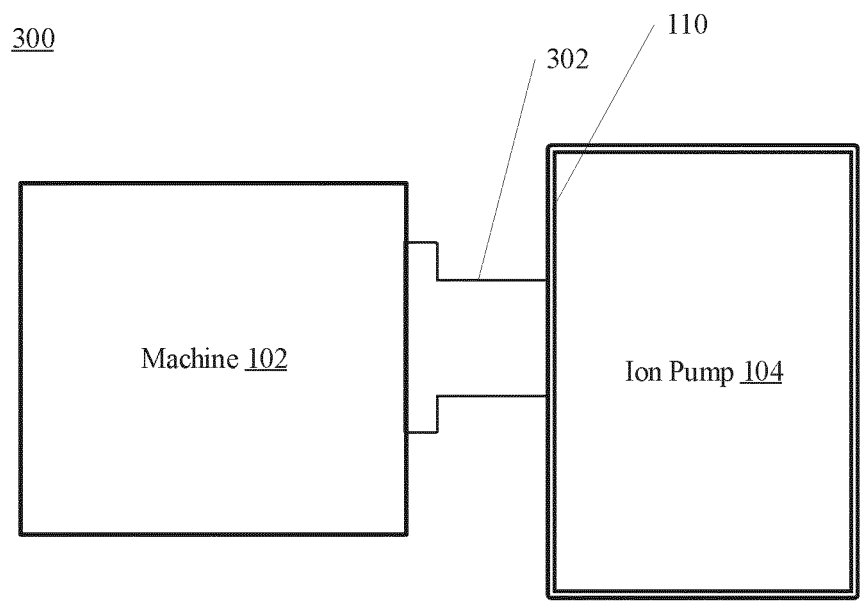
FIG. 3
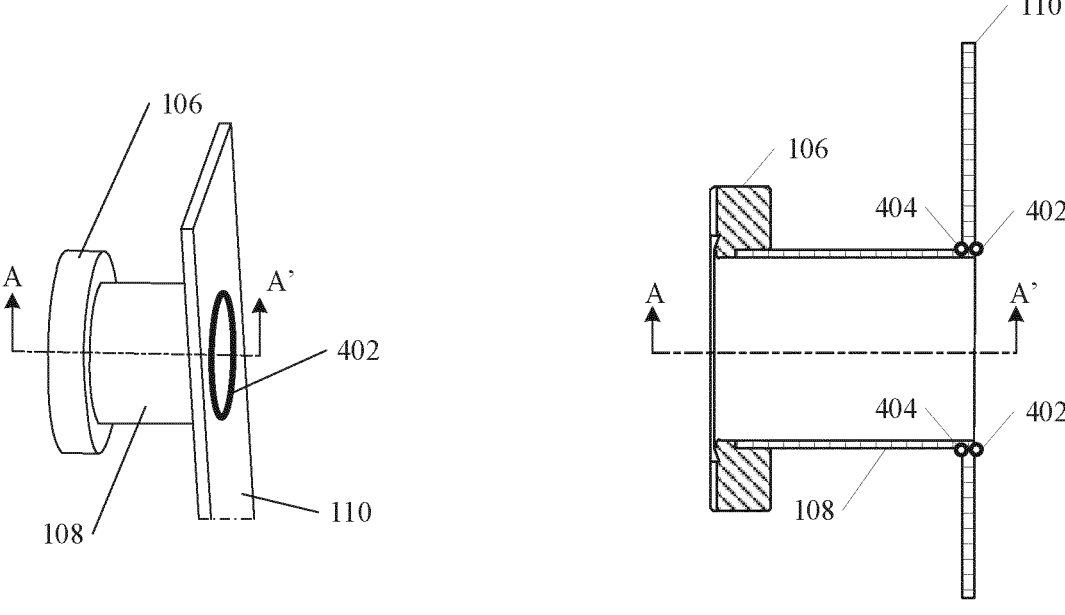
FIG. 4A                    FIG. 4B

700

1000

1002

1006    1004

1300

VIBRATION DAMPING AND RESONANCE REDUCTION FOR ION PUMP

CROSS-REFERENCE TO RELATED APPLICATIONS

This application claims priority to International Application No. PCT/EP2021/052705, filed Feb. 4, 2021, and published as WO 2021/156387 A1, which claims priority of U.S. application 62/971,111 which was filed on Feb. 6, 2020, and U.S. application 63/011,907 which was filed on Apr. 17, 2020. The contents of these applications are incorporated herein by reference in their entireties.

TECHNICAL FIELD

The present disclosure generally relates to the field of ion pumps and, in particular, vibration dampening and resonance reduction for ion pumps.

BACKGROUND

An ion pump is a type of vacuum pump for producing vacuum in a vessel. The ion pump has a cavity. When the cavity is connected to the vessel, gas in the vessel can flow into the cavity. The ion pump can discharge electrons into the cavity that can ionize atoms and molecules of the gas. The ions of the gas can be accelerated by an electric field generated inside the cavity by an anode and a cathode, and eventually strike the cathode. The cathode can be made of chemically active materials and can trap the ions underneath the surface of the materials. Also, some cathode materials can be sputtered by the ions onto a wall of the cavity. The sputtered cathode materials can continue to absorb ions. As a result, gas inside the vessel can be extracted, and the vacuum can be produced in the vessel.

Ion pumps are capable of generating pressures in a vessel as low as 10-11 mbar. Unlike other types of vacuum pumps, ion pumps have no moving parts and do not use working fluid (e.g., oil). Ion pumps generate little vibration, need little maintenance, and produce little contamination. Because of such advantages, ion pumps are widely used in high-precision apparatuses that use vacuum, such as a scanning electron microscope (SEM).

SUMMARY

Embodiments consistent with the present disclosure include apparatuses, systems, and methods for reducing resonance for an ion pump. In some embodiments, an ion pump may include a pump body that includes a wall, the wall including a first opening. The ion pump may also include a housing configured to hold the pump body. The ion pump may further include a T-shape connector configured to secure the pump body to the housing. The ion pump may further include an inlet pipe connected to the first opening. The inlet pipe may include a pipe portion having a first end portion, wherein the first end portion's outer surface is inside the first opening, and the first end portion is secured to the first opening on a first side of the wall inside the pump body and on an outer surface of the first end portion outside the pump body. The inlet pipe may also include a flange portion having a second opening, wherein the flange portion is secured to a second end portion of the pipe portion such that stiffness of connection of the flange portion and the second end portion is greater than or equal to $10^7$ Newton Per Meter. The inlet pipe may further include a feature configured to reinforce connection of the first end portion and the first opening, wherein the feature connects the outer surface of the first end portion to a second side of the wall outside the pump body such that stiffness of the connection of the first end portion and the first opening is greater than or equal to $10^7$ Newton Per Meter.

In some embodiments, a charged-particle inspection system may include a charged-particle inspection apparatus. The charged-particle inspection system may also include an ion pump. The ion pump may include a pump body that includes a wall, the wall including a first opening. The ion pump may also include a housing configured to hold the pump body. The ion pump may further include a T-shape connector configured to secure the pump body to the housing. The ion pump may further include an inlet pipe connected to the first opening. The inlet pipe may include a pipe portion having a first end portion, wherein the first end portion's outer surface is inside the first opening, and the first end portion is secured to the first opening on a first side of the wall inside the pump body and on an outer surface of the first end portion outside the pump body. The inlet pipe may also include a flange portion having a second opening, wherein the flange portion is secured to a second end portion of the pipe portion such that stiffness of connection of the flange portion and the second end portion is greater than or equal to 107 Newton Per Meter. The inlet pipe may further include a feature configured to reinforce connection of the first end portion and the first opening, wherein the feature connects the outer surface of the first end portion to a second side of the wall outside the pump body such that stiffness of the connection of the first end portion and the first opening is greater than or equal to 107 Newton Per Meter.

In some embodiments, an ion pump may include a pump body including a wall, the wall including a first opening. The ion pump may also include an inlet pipe connected to the first opening. The inlet pipe may include a pipe portion having a first end portion secured to the first opening. The inlet pipe may also include a flange portion having a second opening, wherein the flange portion is secured to a second end portion of the pipe portion. Inlet pipe may further include a damper attached to the flange portion opposite to the second end portion, configured to attenuate vibration energy.

In some embodiments, an ion pump may include a pump body including a wall, the wall including a first opening. The ion pump may also include an inlet pipe connected to the first opening. The inlet pipe may include a pipe portion having a first end portion secured to the first opening. The inlet pipe may also include a flange portion having a second opening, wherein the flange portion is secured to a second end portion of the pipe portion such that stiffness of connection of the flange portion and the second end portion is greater than or equal to 107 Newton Per Meter.

In some embodiments, a charged-particle inspection system may include a charged-particle inspection apparatus. The charged-particle inspection system may also include an ion pump. The ion pump may include a pump body including a wall, the wall including a first opening. The ion pump may also include an inlet pipe connected to the first opening. The inlet pipe may include a pipe portion having a first end portion secured to the first opening. The inlet pipe may also include a flange portion having a second opening, wherein the flange portion is secured to a second end portion of the pipe portion such that stiffness of connection of the flange portion and the second end portion is greater than or equal to 107 Newton Per Meter.

In some embodiments, an ion pump may include a pump body including a wall. The ion pump may also include a housing configured to hold the pump body. The ion pump may further include a T-shape connector configured to secure the pump body to the housing. The wall may include an inlet pipe portion extruding from the wall, the inlet pipe portion being cast with the wall as a single part. The inlet pipe portion may include a first opening enclosed by an inner surface of the inlet pipe portion, the first opening connecting a space inside the inlet pipe portion and a space inside the wall. The inlet pipe portion may further include a flange-shape portion at an end of the inlet pipe portion.

In some embodiments, a charged-particle inspection system may include a charged-particle inspection apparatus. The charged-particle inspection system may also include an ion pump. The ion pump may also include a housing configured to hold the pump body. The ion pump may further include a T-shape connector configured to secure the pump body to the housing. The wall may include an inlet pipe portion extruding from the wall, the inlet pipe portion being cast with the wall as a single part. The inlet pipe portion may include a first opening enclosed by an inner surface of the inlet pipe portion, the first opening connecting a space inside the inlet pipe portion and a space inside the wall. The inlet pipe portion may further include a flange-shape portion at an end of the inlet pipe portion.

In some embodiments, an ion pump may include a pump body including a wall. The wall may include an inlet pipe portion extruding from the wall, the inlet pipe portion being cast with the wall as a single part. The inlet pipe portion may include a first opening enclosed by an inner surface of the inlet pipe portion, the first opening connecting a space inside the inlet pipe portion and a space inside the wall. The inlet pipe portion may further include a flange-shape portion at an end of the inlet pipe portion.

In some embodiments, a charged-particle inspection system may include a charged-particle inspection apparatus. The charged-particle inspection system may also include an ion pump. The ion pump may include a pump body including a wall. The wall may include an inlet pipe portion extruding from the wall, the inlet pipe portion being cast with the wall as a single part. The inlet pipe portion may include a first opening enclosed by an inner surface of the inlet pipe portion, the first opening connecting a space inside the inlet pipe portion and a space inside the wall. The inlet pipe portion may further include a flange-shape portion at an end of the inlet pipe portion.

In some embodiments, a pump may include a pump body. The pump may also include a damping element coupled to the pump body, wherein the pump body and the damping element form a mass-based damper, and wherein the pump body forms a mass component of the mass-based damper; and the damping element forms a damping component of the mass-based damper.

In some embodiments, a pump may include a pump body configured to be secured to a column of a charged-particle inspection apparatus. The pump may also include a sensor coupled to the pump body. The pump may further include an actuator coupled to the pump body. The pump may further include a circuitry communicatively coupled to the sensor and the actuator. The circuitry may be configured to: receive, from the sensor, motion data indicative of a vibration of the column; determine a damping for attenuating an amplitude of the vibration of the column based on the motion data; and actuate the actuator to react to the vibration of the column in accordance with the damping.

In some embodiments, a charged-particle inspection system may include a charged-particle inspection apparatus. The charged-particle inspection system may also include a pump. The pump may include a pump body. The pump may also include a damping element coupled to the pump body, wherein the pump body and the damping element form a mass-based damper, and wherein the pump body forms a mass component of the mass-based damper; and the damping element forms a damping component of the mass-based damper.

In some embodiments, a charged-particle inspection system may include a charged-particle inspection apparatus. The charged-particle inspection system may also include a pump. The pump may include a pump body configured to be secured to a column of a charged-particle inspection apparatus. The pump may also include a sensor coupled to the pump body. The pump may further include an actuator coupled to the pump body. The pump may further include a circuitry communicatively coupled to the sensor and the actuator. The circuitry may be configured to: receive, from the sensor, motion data indicative of a vibration of the column; determine a damping for attenuating an amplitude of the vibration of the column based on the motion data; and actuate the actuator to react to the vibration of the column in accordance with the damping.

BRIEF DESCRIPTION OF DRAWINGS

FIG. 3 illustrates yet another example system where resonance of an ion pump is reduced by increasing a natural frequency of the ion pump, consistent with some embodiments of the present disclosure.

FIG. 4A illustrates an example connection between a pipe and a wall of an ion pump, consistent with some embodiments of the present disclosure.

FIG. 4B illustrates an example reinforced connection between a pipe and a wall of an ion pump, consistent with some embodiments of the present disclosure.

DETAILED DESCRIPTION

Figure 1A:
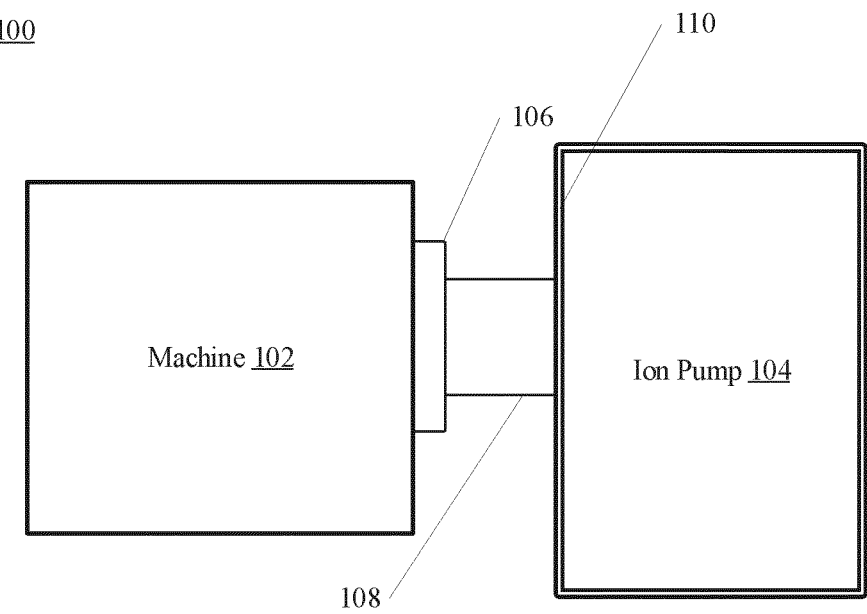
FIG. 1A illustrates an example system where a vacuum in a machine is produced by an ion pump, consistent with some embodiments of the present disclosure.

Reference will now be made in detail to example embodiments, examples of which are illustrated in the accompanying drawings. The following description refers to the accompanying drawings in which the same numbers in different drawings represent the same or similar elements unless otherwise represented. The implementations set forth in the following description of example embodiments do not represent all implementations consistent with the disclosure. Instead, they are merely examples of apparatuses and methods consistent with aspects related to the subject matter recited in the appended claims. For example, although some embodiments are described in the context of utilizing charged particles (e.g., electrons), the disclosure is not so limited. Other types of charged particles (e.g., protons, ions, muons, or any other particle carrying electric charges) may be similarly applied.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smartphone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process; that is, to improve the overall yield of the process.

One component of improving yield is monitoring the chip-making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures of the wafer. The image can be used to determine if the structure was formed properly in the proper location. If the structure is defective, then the process can be adjusted, so the defect is less likely to recur.

The working principle of a SEM is similar to a camera. A camera takes a picture by receiving and recording brightness and colors of light reflected or emitted from people or objects. A SEM takes a "picture" by receiving and recording energies or quantities of charged particles (e.g., electrons) reflected or emitted from the structures. Before taking such a "picture," an charged particle beam may be provided onto the structures, and when the charged particles are reflected or emitted ("exiting") from the structures, a detector of the SEM may receive and record the energies or quantities of those charged particles to generate an image. To take such a "picture," some SEMs use a single charged particle beam (referred to as a "single-beam SEM"), while some SEMs use multiple charged particle beams (referred to as a "multi-beam SEM") to take multiple "pictures" of the wafer. By using multiple charged particle beams, the SEM may provide more charged particle beams onto the structures for obtaining these multiple "pictures," resulting in a bigger field of view. Accordingly, the detector may need less time to scan the same area than a single-beam SEM, and may generate images of the structures of the wafer with higher efficiency and faster speed.

Because the charged-particle beams can easily interact with atoms and molecules in the air and cause diffusion of energy and contamination of unwanted particles, the SEM normally needs to work in a vacuum environment. Typically, the SEM has a closed vessel (a "column") that encloses a charged-particle source that discharge charged particles, a projection system projecting charged-particle beams formed from the discharged charged particles onto a sample stage, the sample stage for holding a sample for inspection, and a charged-particle detection sub-system. For acquiring the vacuum in the column, a vacuum pump may be connected to the column to extract gas. Ion pumps are commonly used for the SEM because of its advantages of generating little vibration, needing little maintenance, and producing little contamination.

The working principle of an ion pump includes separating ("ionizing") atoms and molecules of the gas into charged particles ("ions"), driving the ions with a strong electric field into an electrode (a "cathode") made of absorption materials, and absorbing the ions using the absorption materials. For example, a cavity of the ion pump may be connected to the vessel, where gas may freely flow between the cavity and the vessel. The ion pump can generate a strong electric field in the cavity using an anode and a cathode. The anode may discharge electrons into the cavity. The ion pump may apply a magnetic field (e.g., an axial magnetic field) and an electric field (e.g., a quadrupole electric field) to shape the discharged electrons into a swirling cloud and stabilize it near the anode. The electron cloud has strong electric charges that may ionize surrounding gas atoms and molecules into ions.

The strong electric field (e.g., typically 3-7 kilovolts) generated by the anode and the cathode may accelerate the ions towards the cathode of the ion pump. The acceleration may cause the ions to impact on the surface of the cathode. The cathode may be made of chemically active materials (e.g., titanium). On impact, some ions may be trapped by the cathode materials underneath its surface, and some ions may sputter some cathode materials onto a wall of the cavity. The sputtered cathode materials may be highly reactive and may continue to absorb the gas in the vessel by a chemical process ("chemisorption") and a physical process ("physisorption"). The above process may remove the gas and ultimately produce extremely low pressure in the vessel.

Typically, one or more ion pumps may be mounted to the column of a SEM. The column may be mounted on top of a chamber that encloses the stage. The one or more ion pumps may generate a vacuum inside the column and the chamber. Typically, the stage may be still and hold multiple samples, and the column may be mounted to a movable component ("metroframe") of a top of the chamber. By moving the metroframe, the column mounted thereon may be moved to scan and inspect different samples on the stage inside the chamber. The column may be excited to vibrate when being moved because of the acceleration and deceleration propagated from the metroframe.

A challenge in existing ion pump designs is that the natural frequency of the ion pump is very low. As a result, the ion pump may easily resonate with low-frequency vibrations in its surrounding environment (e.g., an individual walking nearby, a vehicle passing nearby, a machine operating nearby, or the like). The resonance of the ion pump may propagate the low-frequency vibrations to the vessel (e.g., a column of a SEM) it connects to. Such vibrations may interfere with components (e.g., the column or the stage) of the high-precision SEM. The interference may cause vibration noise in SEM images. The vibration noise may limit the accuracy of data (e.g., critical dimension data) derived from the SEM images, which may limit the inspection resolution of the SEM. Current designs of ion pumps mainly focus on performance metrics (e.g., vacuum pressure, pumping speed, or the like) and seldomly focus on dynamic characteristics (e.g., its natural frequency), which may limit inspection quality of the SEM due to the above reasons.

Some disclosed embodiments provide apparatuses, systems, and methods that reduce resonance of an ion pump. In some embodiments, a damper may be added to a connection between the ion pump and a machine (e.g., a SEM) it connects to. The damper may attenuate vibration energy and may impede or stop the propagation of the vibration from the ion pump to the machine. In some embodiments, the connection between the ion pump and the machine may be reinforced to increase its stiffness, as a result of which the natural frequency of the ion pump may be increased. In some embodiments, internal structures of the ion pump can be reinforced to increase its stiffness, as a result of which the natural frequency of the ion pump may be increased. By adding the damper or increasing the natural frequency of the ion pump, the likelihood of the ion pump resonating with low-frequency environmental vibrations may be greatly reduced, and the inspection quality of the SEM can be improved.

Another challenge in existing ion pump designs is that, when the column is excited to vibrate, the vibration of the column (having an "excitation frequency") can also propagate to an ion pump mounted thereon, and the vibration of the ion pump (having a "response frequency") may in turn amplify the vibration of the column in some cases, especially when the excitation frequency is near a natural frequency of the ion pump (i.e., the ion pump resonate with the excitation frequency). Such vibrations may interfere with components (e.g., the column or the stage) of the high-precision SEM. The interference may cause vibration noise in SEM images. The vibration noise may limit the accuracy of data (e.g., critical dimension data) derived from the SEM images, which may limit the inspection resolution of the SEM. Current designs of ion pumps mainly focus on performance metrics (e.g., vacuum pressure, pumping speed, or the like) and seldomly focus on dynamic characteristics (e.g., damping, module mechanical resonance frequencies, stiffness, or the like), which may limit inspection quality of the SEM due to the above reasons.

In some existing designs, scaffolds may be installed in a single-beam system (e.g., a single-beam SEM) between the ion pump and the metroframe to reinforce the stiffness of the connection between the ion pump and the column, and a rubber layer may be installed in the connection to dampen the vibrations. However, the rubber may also add additional stiffness to the connection besides the damping. Moreover, in different applications of the SEM, the acceleration and deceleration of the metroframe may be different (e.g., in a high-speed scanning mode or a low-speed scanning mode), which in turn causes different response frequencies of the ion pump. If the dynamic characteristics of the rubber is not adjusted accordingly, it may be very difficult to reproduce the same additional stiffness and damping introduced by the rubber in different applications, which may further cause difficulty in calibration to minimize the quasi-static swing of the top of the column. Further, the scaffold solution cannot be used in a multi-beam system (e.g., a multi-beam SEM).

Some disclosed embodiments provide apparatuses, systems, and methods that dampen a vibration of a vacuum vessel (e.g., a column of a SEM) mounted with a pump (e.g., an ion pump). The pump may be secured by a connector to the vacuum vessel. In some embodiments, a damping element may be coupled to a pump body of the pump, and the pump body and the damping element may form a mass-based damper (e.g., a tuned mass damper, a skyhook damper, or an active-mass damper). The pump body may form a mass component of the mass-based damper. The damping element may form a damping component of the mass-based damper. The connector and the damping element may form an elastic component (e.g., a spring component) of the mass-based damper. In such a design, no additional mass component (e.g., a tuned mass in a tuned mass damper) is needed for damping the vibration. Also, the dynamic characteristics of the damping element may be configurable to accommodate different applications of a charged-particle inspection apparatus that includes the vacuum vessel such that the vibration of the vacuum vessel may be attenuated or minimized in operation. By doing so, the inspection quality of the charged-particle inspection apparatus can be improved, and the damping of the vibrations can be adapted for different applications.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1A illustrates an example system 100 where a vacuum in a machine is produced by an ion pump, consistent with some embodiments of the present disclosure. System 100 may include a machine 102 (e.g., a SEM), an ion pump 104, and a connection (referred to as an "inlet pipe") between them. The inlet pipe is a pipe for inletting gas extracted from machine 102. The inlet pipe may include a flange 106 and a pipe 108. Flange 106 may be fixed (e.g., by bolts, screws, or any fixture means) onto a vessel (e.g., a column) of machine 102. Flange 106 and pipe 108 may be connected (e.g., by screw threads, welding, or the like). Pipe 108 may be fixed (e.g., by bolting, screwing, pressing, welding, or any fixture means) onto a wall 110 of ion pump 104. When operating, the gas in the vessel of machine 102 may be extracted by ion pump 104 through pipe 108.

Figure 1B:
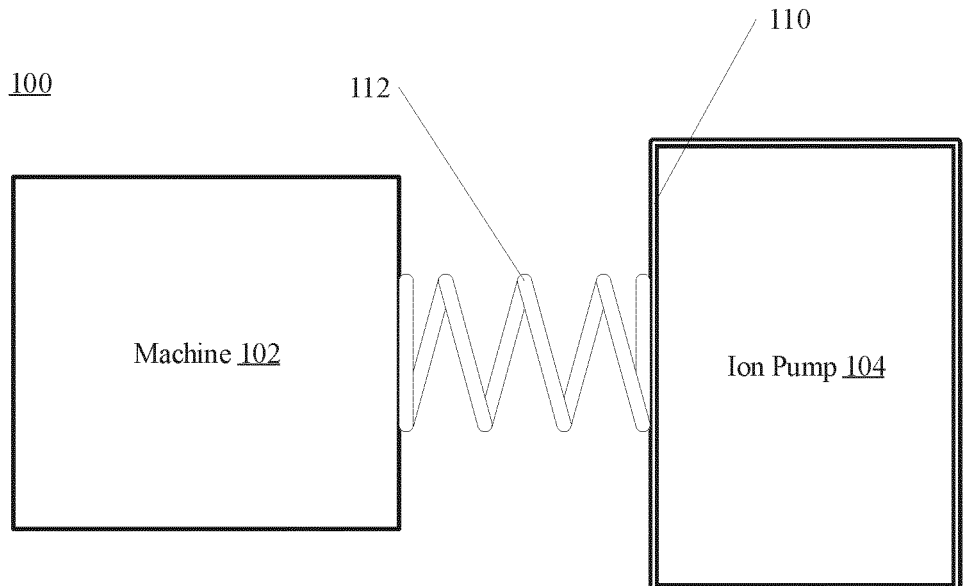
FIG. 1B illustrates an abstraction of the system of FIG. 1A, consistent with some embodiments of the present disclosure.

System 100 may be a dynamic system. FIG. 1B illustrates an abstraction of system 100 of FIG. 1A, consistent with some embodiments of the present disclosure. In FIG. 1B, the connection between machine 102 and ion pump 104 (e.g., including flange 106, pipe 108, and wall 110) may be abstracted as an equivalent spring 112 that may represent the elasticity of the connection between machine 102 and ion pump 104. Under such an abstraction, a natural frequency f of ion pump 104 may be determined as Eq. (1):

$$f = \frac{1}{2\pi}\sqrt{\frac{k}{m}} \tag{1}$$

where k represents stiffness of equivalent spring 112, and m represents mass of ion pump 104. For existing ion pumps, k may have a small value, and m may have a large value. As a result, f may be very low (e.g., equal to or smaller than 30 Hz when m is 10 kilograms). The surrounding environment of ion pump 104 may include various sources of vibrations, such as, for example, walking individuals, operating machines, electric power, or the like. Such sources of vibrations may cover a spectrum of frequencies, including frequencies lower than 30 Hz. For a normal working environment of ion pump 104, existing sources of vibrations may easily cause ion pump 104 to resonate with the low-frequency vibrations of the sources, and the unwanted resonance of ion pump 104 may propagate to machine 102 via equivalent spring 112.

Figures 1C, 1D:
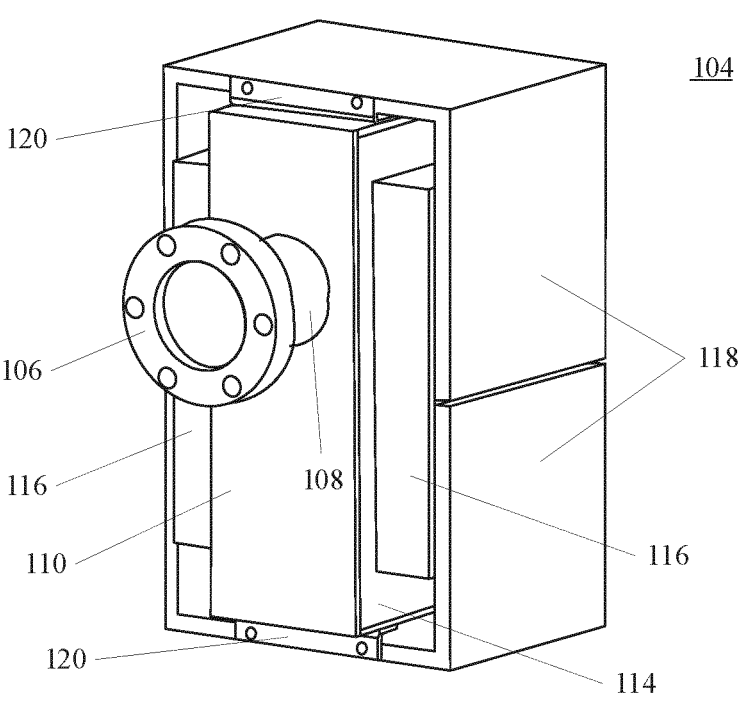
FIG. 1C illustrates an example ion pump in the system of FIG. 1A, consistent with some embodiments of the present disclosure.
FIG. 1D illustrates an abstraction of the system of FIG. 1C, consistent with some embodiments of the present disclosure.

In some embodiments, system 100 may include additional dynamic factors inside ion pump 104. FIG. 1C illustrates an example of ion pump 104 in system 100, consistent with some embodiments of the present disclosure. In FIG. 1C, ion pump 104 may include a pump body 114. Pump body 114 may include a cavity inside for gas extraction with wall 110 on its outside. Pipe 108 may connect to wall 110, and flange 106 may connect to pipe 108. Two magnet sets surround pump body 114 in FIG. 1C. A magnet set may include various components, including a magnet 116 and one or more pole pieces 118. Connectors 120 may be used to fix pump body 114 onto the magnet sets.

In some cases, if connectors 120 do not provide sufficiently stiff connections, the magnet sets and other components of ion pump 104 may be deemed as being elastically connected. FIG. 1D illustrates an abstraction of a system where ion pump 104 of FIG. 1C is connected to machine 102 in FIG. 1A via flange 106 and pipe 108, consistent with some embodiments of the present disclosure. In FIG. 1D, connectors 120 of FIG. 1C between ion pump part 122 (e.g., including flange 106, pipe 108, wall 110, pump body 114) and ion pump part 124 (e.g., including the magnet sets) may be abstracted as an equivalent spring 126. That is, equivalent spring 126 may be the additional dynamic factor, which may provide an additional cause for ion pump 104 to resonate with low-frequency vibrations of its surrounding environment.

This disclosure describes various approaches to reduce the resonance of ion pump 104. A first approach is to add damping between ion pump 104 and machine 102 for attenuating vibration energy. A second approach is to increase the natural frequency f of ion pump 104. In some embodiments, the resonance of ion pump 104 may be reduced by applying both the first approach (adding damping) and the second approach (increasing the natural frequency f). Examples of such approaches of reducing the resonance of ion pump 104 in system 100 are set forth in the following descriptions.

Figure 2A:
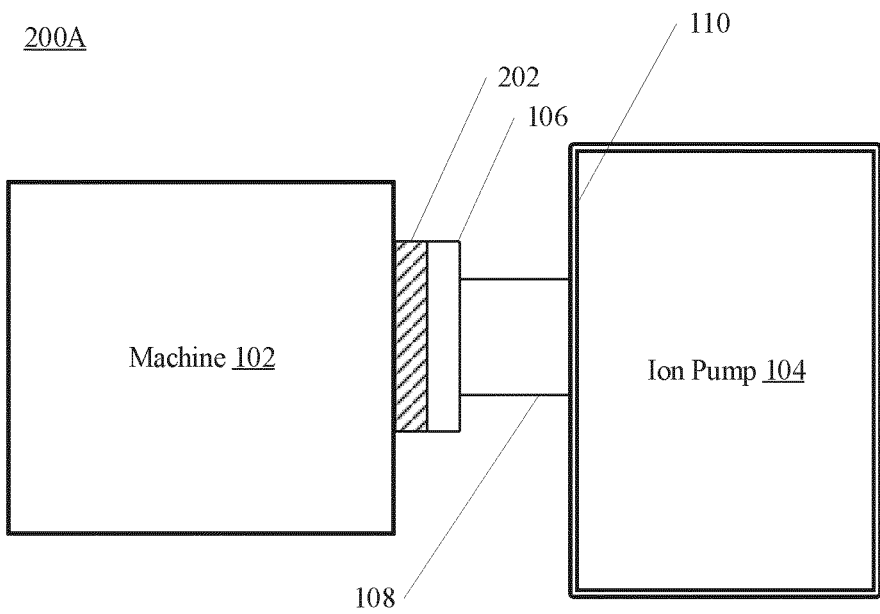
FIG. 2A illustrates an example system where resonance of an ion pump is reduced by a damper, consistent with some embodiments of the present disclosure.

There are various approaches to add damping (e.g., provided by a damper) between flange 106 and machine 102. In some embodiments, the damper may be an elastic component. FIG. 2A illustrates an example system 200A where resonance of ion pump 104 is reduced by a damper, consistent with some embodiments of the present disclosure. In FIG. 2A, an elastic component 202 is provided between flange 106 and machine 102. For example, if flange 106 is bolted onto machine 102, elastic component 202 may be a rubber provided with holes that allow bolts of flange 106 to penetrate through, by which the rubber may be fixed between flange 106 and machine 102. Elastic component 202 can attenuate vibration energy of ion pump 104, by which the propagation of the resonance from ion pump 104 to machine 102 may be reduced or stopped.

Figure 2B:
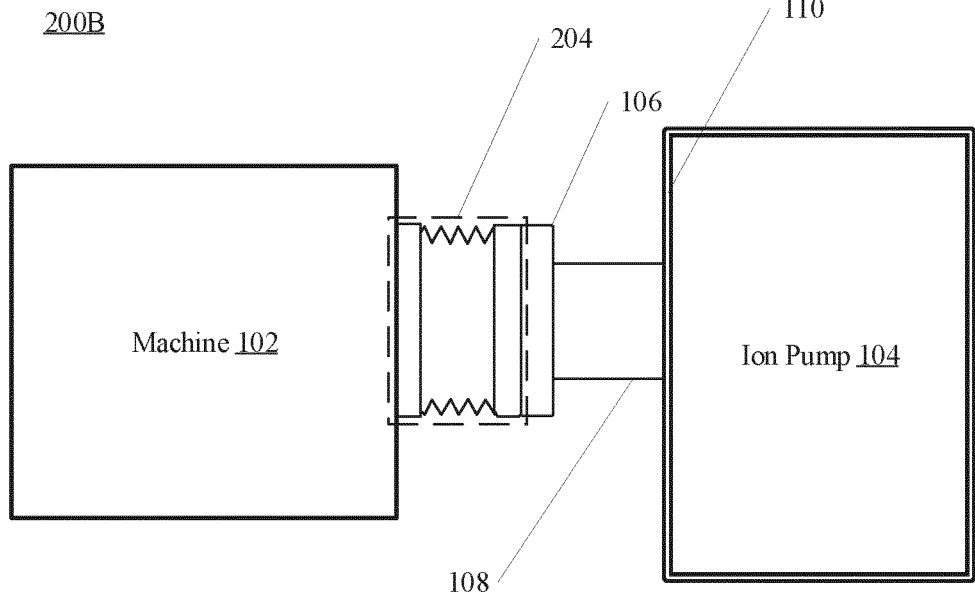
FIG. 2B illustrates another example system where resonance of an ion pump is reduced by a damper, consistent with some embodiments of the present disclosure.

In some embodiments, the damper may be a flexible component. FIG. 2B illustrates an example system 200B where resonance of ion pump 104 is reduced by a damper, consistent with some embodiments of the present disclosure. In FIG. 2B, a flexible component 204 (e.g., a hosepipe, a bellows, or the like) is provided between flange 106 and machine 102. For example, flexible component 204 may be a bellows that is provided with connection components (e.g., screw threads) on both ends. The bellows can be connected to flange 106 at a first end and connected to machine 102 at a second end. Flexible component 204 can also attenuate vibration energy of ion pump 104. It should be noted that, besides the elastic component and flexible component, the damper between ion pump 104 and machine 102 may be implemented in other forms and are not limited to the examples provided herein. Also, besides between flange 106 and machine 102, the position where the damper is provided may be in other positions of system 200A or 200B, such as between flange 106 and pipe 108, between pipe 108 and ion pump 104, or any other position suitable for providing the damper between ion pump 104 and machine 102.

There are various approaches to increase the natural frequency f of ion pump 104. In accordance with Eq. (1), in some embodiments, this disclosure describes several approaches to increase the natural frequency f. A first approach is to increase stiffness k of equivalent spring 112. A second approach is to reduce the mass m of ion pump 104. In accordance with FIG. 1D, in some embodiments, this disclosure provides a third approach to increase the natural frequency f by increasing the stiffness of equivalent spring 126. In some embodiments, the natural frequency f may be increased by applying any combination of the first approach (increasing stiffness k of equivalent spring 112), the second approach (reducing the mass m of ion pump 104), and the third approach (increasing the stiffness of equivalent spring 126). Examples of such approaches of increasing the natural frequency f of ion pump 104 are set forth in the following descriptions.

In some embodiments, stiffness k of equivalent spring 112 may be increase by eliminating free rotation between flange 106 and pipe 108. In some embodiments, the connection of flange 106 and pipe 108 may be reinforced such that the stiffness of the connection may be greater than or equal to 107 Newton Per Meter, as a result of which the natural frequency of ion pump 104 may be increased and thus become less responsive or non-responsive to vibrations in its surrounding environment, and the operation and performance of machine 102 may be improved. In an example where machine 102 is a SEM, by reinforcing the connection of flange 106 and pipe 108 such that the stiffness of the connection is greater than or equal to 107 Newton Per Meter, the natural frequency of the ion pump is increased to 150 Hz, enabling a reduction of the susceptibility of the SEM to lower frequency vibrations and a corresponding reduction of vibrational noise in SEM images. FIG. 3 illustrates an example system 300 where resonance of ion pump 104 is reduced by increasing the natural frequency f of ion pump 104, consistent with some embodiments of the present disclosure. In FIG. 3, flange 106 and pipe 108 of FIG. 1A are united as part 302. For example, flange 106 may be welded to pipe 108. In another example, part 302 may be molded or cast as a single part. It should be noted that flange 106 and pipe 108 may be united using other approaches and are not limited to the examples provided herein.

In some embodiments, stiffness k of equivalent spring 112 may be increased by thickening a wall of pipe 108. For example, the wall of pipe 108 may be thickened by increasing its outer diameter while keeping its inner diameter unchanged, which may ensure the pumping speed of ion pump 104 is not affected. For example, the wall of pipe 108 may be 1.5 millimeters before thickening, and ion pump 104 may have a mass m of 10 kilograms and a low natural frequency f of 30 Hz. In some embodiments, the natural frequency f of ion pump 104 may be 40 Hz after thickening the wall of pipe 108 to be 1.6 millimeters. In some embodiments, the natural frequency f of ion pump 104 may be on or above 100 Hz after thickening the wall of pipe 108 to be above 3 millimeters. In some embodiments, the natural frequency f of ion pump 104 may be on or above 150 Hz after thickening the wall of pipe 108 to be above 4.5 millimeters. In some embodiments, the natural frequency f of ion pump 104 may be on or above 200 Hz after thickening the wall of pipe 108 to be above 7 millimeters. It should be noted that the wall of pipe 108 may be thickened to any thickness, depending on a target natural frequency f to achieve, and the thickness is not limited to the above-described examples in this disclosure.

In some embodiments, stiffness k of equivalent spring 112 may be increased by shortening the length of pipe 108. For example, the length of pipe 108 may be 45 millimeters before the shortening, and ion pump 104 may have a mass m of 10 kilograms and a low natural frequency f of 30 Hz. In some embodiments, the natural frequency f of ion pump 104 may be 40 Hz after shortening the length of pipe 108 to be 41 millimeters. In some embodiments, the natural frequency f of ion pump 104 may be on or above 100 Hz after shortening the length of pipe 108 to be below 39 millimeters. In some embodiments, the natural frequency f of ion pump 104 may be on or to be below 150 Hz after shortening the length of pipe 108 to be below 36 millimeters. In some embodiments, the natural frequency f of ion pump 104 may be on or to be below 200 Hz after shortening the length of pipe 108 to be below 31 millimeters. It should be noted that the length of pipe 108 may be thickened to any thickness, depending on a target natural frequency f to achieve, and the thickness is not limited to the below-described examples in this disclosure.

In some embodiments, stiffness k of equivalent spring 112 may be increased by reinforcing a connection between pipe 108 and wall 110. For example, in many existing ion pumps, pipe 108 and wall 110 may be connected by inner welding before such reinforcement, and ion pump 104 may have a mass m of 10 kilograms and a low natural frequency f of 30 Hz. FIG. 4A illustrates an example inner welding between pipe 108 and wall 110, consistent with some embodiments of the present disclosure. In FIG. 4A, flange 106 may be welded to wall 110 in an inside rim 402 of wall 110. FIG. 4B illustrates another example connection between pipe 108 and wall 110, consistent with some embodiments of the present disclosure. FIG. 4B is a section view of A-A' in FIG. 4A. In FIG. 4B, flange 106 and wall 110 may be connected by both inner welding and outer welding. The outer welding may be implemented on an outside rim 404 of pipe 108. It should be noted that the connection between pipe 108 and wall 110 may be reinforced in other approaches (e.g., by bonding, glue, adhesion, or the like) and are not limited to the examples provided herein.

Figure 5B:
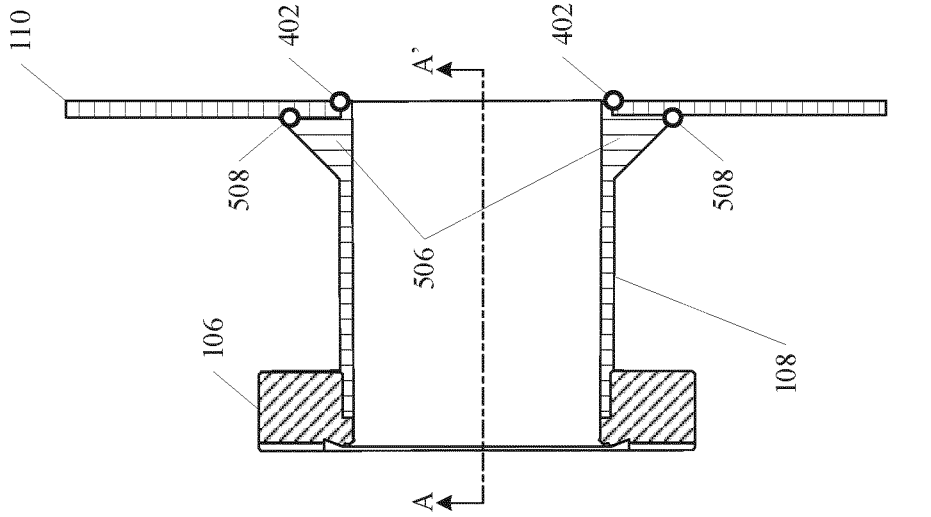
FIGS. 5A-5F illustrates example reinforced connections between a pipe and a wall of an ion pump, consistent with some embodiments of the present disclosure.
Figure 5A:
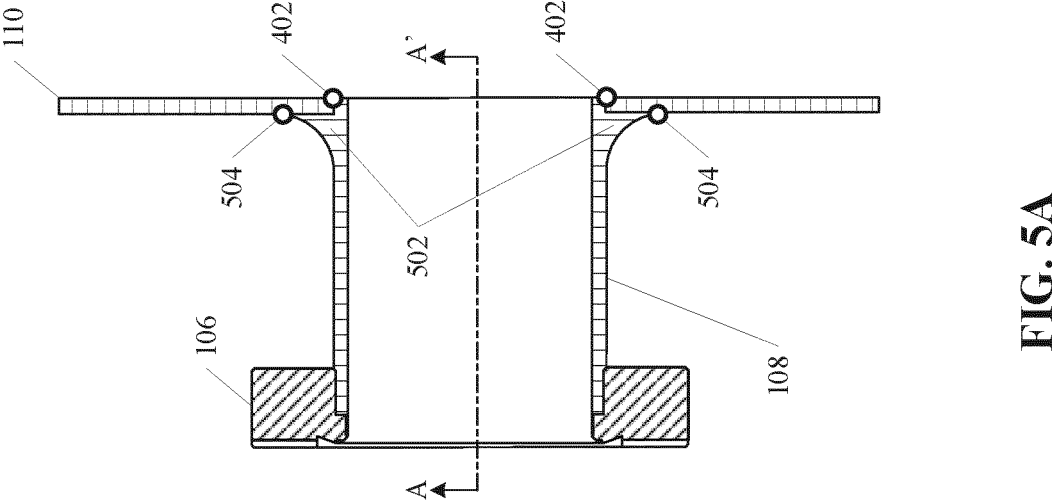
Figure 5D:
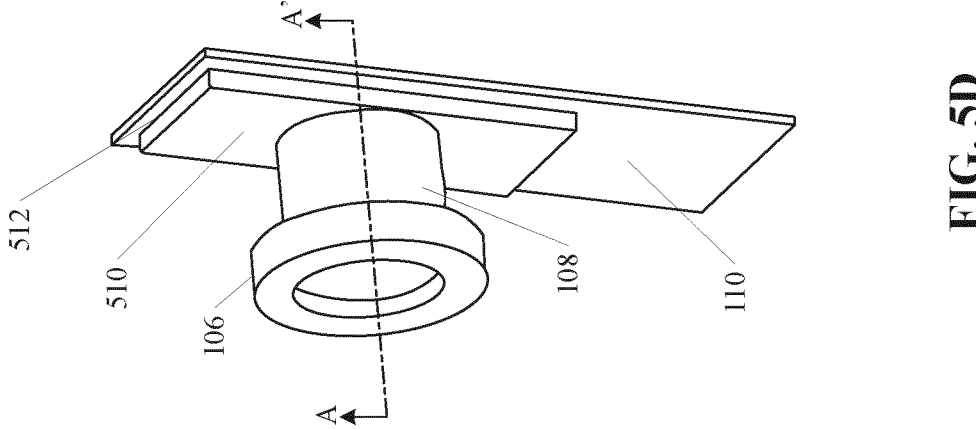
Figure 5C:
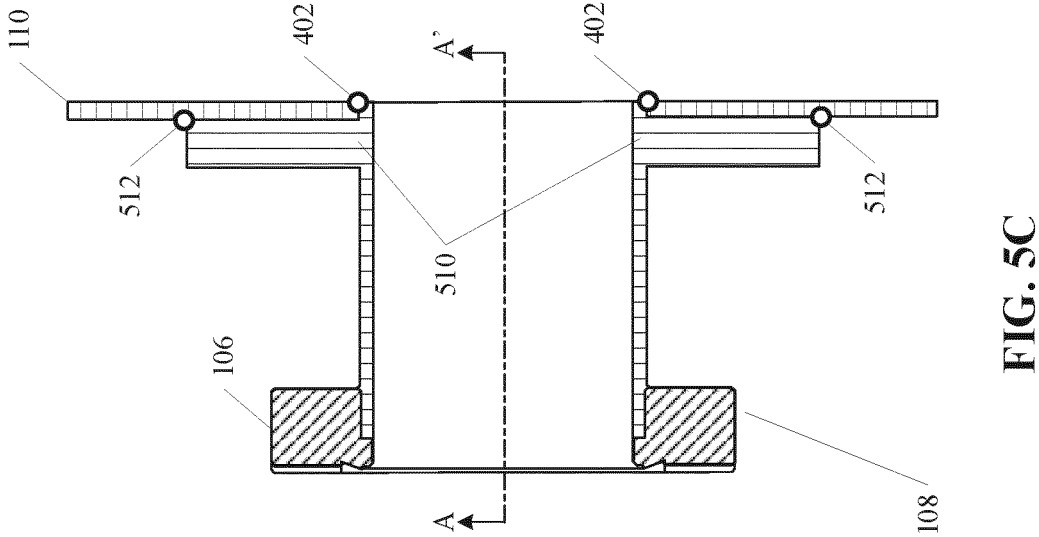

In some embodiments, the reinforcement of the connection between pipe 108 and wall 110 may be further enhanced by adding an additional feature or material to an outer surface of pipe 108 and applying outer welding. In some embodiments, the connection between pipe 108 and wall 110 may be reinforced such that its stiffness may be greater than or equal to 107 Newton Per Meter. FIGS. 5A-5F illustrate examples of reinforced connections between pipe 108 and wall 110, consistent with some embodiments of the present disclosure. In FIGS. 5A-5F, the inner welding may be implemented on the inside rim 402 of wall 110, similar to FIGS. 4A-4B. FIGS. 5A-5C and 5F are section views of A-A' in FIGS. 4A and 5D. FIG. 5A illustrates a connection between pipe 108 and wall 110 further reinforced by adding a fillet 502 on an outer surface of pipe 108 at an end thereof near wall 110, consistent with some embodiments of the present disclosure. The outer welding may be implemented on an outside rim 504 of fillet 502. FIG. 5B illustrates a connection between pipe 108 and wall 110 further reinforced by adding a chamfer 506 on the outer surface of pipe 108 at the end thereof near wall 110, consistent with some embodiments of the present disclosure. The outer welding may be implemented on an outside rim 508 of chamfer 506. FIGS. 5C-5D illustrate a connection between pipe 108 and wall 110 further reinforced by adding a plate 510 on the outer surface of pipe 108 at the end thereof near wall 110, consistent with some embodiments of the present disclosure. The outer welding may be implemented on an outside rim 512 of plate 510.

For example, before adding any additional feature to reinforce the connection between pipe 108 and wall 110, ion pump 104 may have a mass m of 10 kilograms and a low natural frequency f of 30 Hz. In some embodiments, plate 510 as shown in FIGS. 5C-5D can be added for such reinforcement. Different thickness of plate 510 may affect the natural frequency f of ion pump 104. In some embodiments, the natural frequency f of ion pump 104 may be on or above 100 Hz after thickening plate 510 to be above 3 millimeters. In some embodiments, the natural frequency f of ion pump 104 may be on or above 150 Hz after thickening plate 510 to be above 6 millimeters. In some embodiments, the natural frequency f of ion pump 104 may be on or above 200 Hz after thickening plate 510 to be above 11 millimeters. It should be noted that plate 510 may be thickened to any thickness, depending on a target natural frequency f to achieve, and the thickness is not limited to the above-described examples in this disclosure.

Figure 5F:
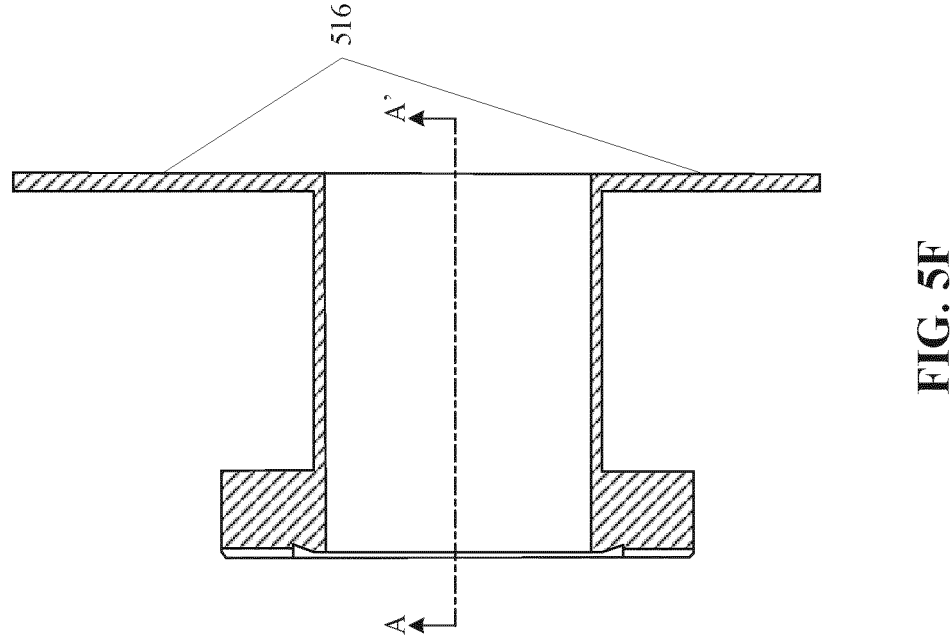
Figure 5E:
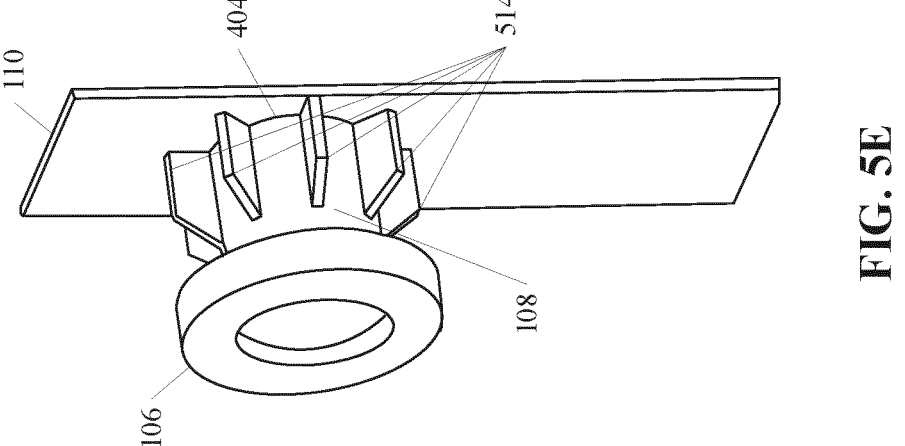

FIG. 5E illustrates a connection between pipe 108 and wall 110 further reinforced by adding ribs 514 on the outer surface of pipe 108 at the end thereof near wall 110, consistent with some embodiments of the present disclosure. The outer welding may be implemented on an outside rim 404 (e.g., as shown in FIG. 4B) and contacting feet between ribs 514 and wall 110. FIG. 5F illustrates connections between flange 106, pipe 108, and wall 110 of FIG. 1A further reinforced by uniting flange 106, pipe 108, and wall 110 as part 516, consistent with some embodiments of the present disclosure. For example, flange 106, pipe 108, and wall 110 may be united by being welded together. As another example, part 516 may be molded or cast as a single part that unites flange 106, pipe 108, and wall 110 in the single molded or cast part. It should be noted that flange 106, pipe 108, and wall 110 may be united via other approaches and are not limited to the examples provided herein. It should also be noted that the connection between pipe 108 and wall 110 may be reinforced by adding features or materials other than the above-described examples in FIGS. 5A-5F, which are not limited by this disclosure.

In some embodiments, with reference to FIG. 1B, stiffness k of equivalent spring 112 may be increased by thickening wall 110. For example, wall 110 may be 2 millimeters before thickening, and ion pump 104 may have a mass m of 10 kilograms and a low natural frequency f of 30 Hz. In some embodiments, the natural frequency f of ion pump 104 may be 40 Hz after thickening wall 110 to be 2.5 millimeters. In some embodiments, the natural frequency f of ion pump 104 may be on or above 100 Hz after thickening wall 110 to be above 5 millimeters. In some embodiments, the natural frequency f of ion pump 104 may be on or above 150 Hz after thickening wall 110 to be above 8 millimeters. In some embodiments, the natural frequency f of ion pump 104 may be on or above 200 Hz after thickening wall 110 to be above 13 millimeters. It should be noted that wall 110 may be thickened to any thickness, depending on a target natural frequency f to achieve, and the thickness is not limited to the above-described examples in this disclosure.

Figure 6B:
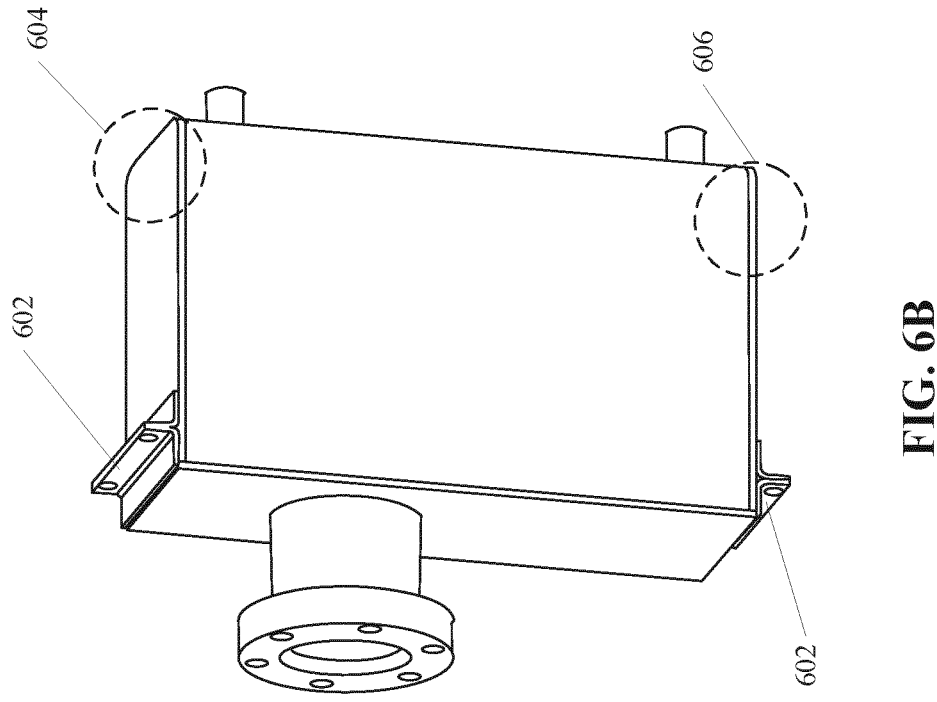
FIG. 6B illustrate example reinforced connectors, consistent with some embodiments of the present disclosure.
Figure 6A:
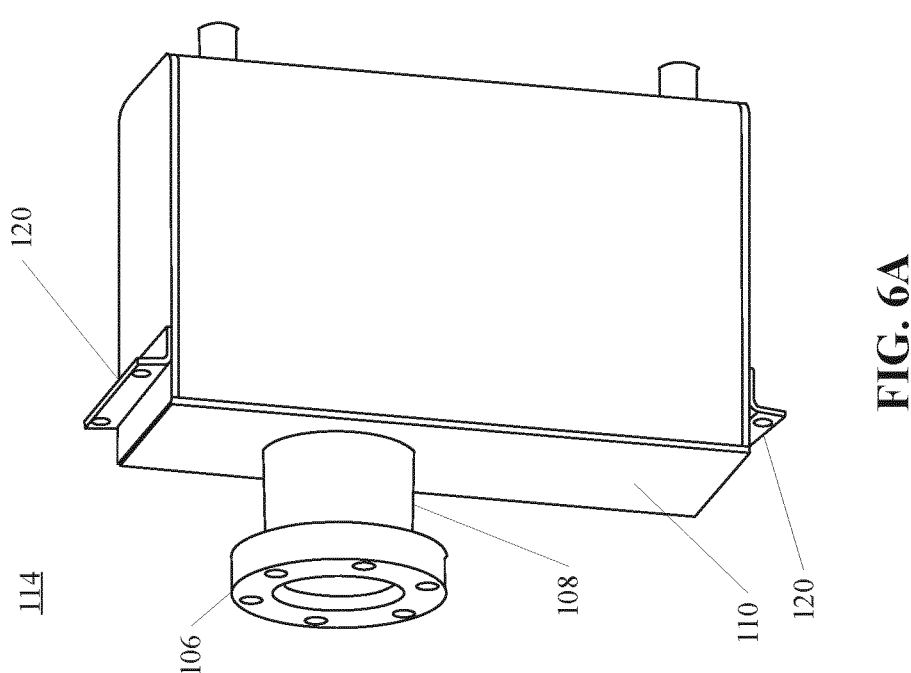
FIG. 6A illustrate an example pump body taken out of the ion pump in FIG. 1C, consistent with some embodiments of the present disclosure.

In some embodiments, natural frequency f of ion pump 104 may be increased by increasing the stiffness of equivalent spring 126 in FIG. 1D. In some embodiments, connectors 120 may be reinforced. FIG. 6A illustrates pump body 114 taken out of ion pump 104 in FIG. 1C, consistent with some embodiments of the present disclosure. FIG. 6A shows that, before reinforcement, connectors 120 may have an "L" shape. In some embodiments, structures of connectors 120 may be changed for reinforcement. FIG. 6B illustrates example connectors 602 reinforced by being formed into a "T" shape, consistent with some embodiments of the present disclosure. For example, each of connectors 602 may be formed by joining (e.g., welding, bolting, screwing, pressing, adhering, or the like) two connectors 120 (in "L" shape) back to back. As another example, connectors 602 may be molded or casted as a single part with the "T" shape. It should be noted that connectors 120 may be reinforced by being formed into other shapes (e.g., "I" shape or a horizontal "H" shape) and is not limited to the examples as shown in FIG. 6B.

In some embodiments, connectors 120 may be reinforced by increasing their thickness. In some embodiments, connectors 120 may be reinforced by adding an additional feature or material (e.g., a fillet, a chamfer, a plate, a rib, or the like) thereto, in a way similar to FIGS. 5A-5E. For example, the added feature may connect and strengthen the bond between a surface of pump body 114 and a surface of a connector 120 that has no contact with pump body 114. In some embodiments, additional connectors (e.g., connectors 120 or connectors 602) may be used to fix pump body 114 to its housing (e.g., pole piece 118 in FIG. 1C). For example, besides the locations of connectors 602, the additional connectors may be added to any combination of region 604, region 606, or any other suitable regions, as shown in FIG. 6B.

For increasing the natural frequency f of ion pump 104, in accordance with Eq. (1), the mass m of ion pump 104 may be reduced. Referring back to FIG. 1C, in some embodiments, at least one of magnet 116 or pole piece 118 may be changed to be made of materials having high magnetic permeability such that the overall weight of magnet 116 or pole piece 118 may be reduced while strength of the magnetic field produced by them may be maintained. For example, the materials of pole piece 118 may be changed from soft iron to ferrite-based materials, Fe—Si—Al alloy powders, or the like. In some embodiments, the mass m of ion pump 104 may be reduced by reducing thickness of magnet 116. It should be noted that other approaches for reducing the mass m may be used, and this disclosure does not limit such approaches to the above-described examples.

It should be noted that, for reducing resonance of ion pump 104, any combination of the foregoing embodiments or examples may be applied. For example, in some embodiments, the natural frequency f of ion pump 104 may be increased to 40 Hz by increasing thickness of pipe 108 to be 1.6 millimeters, decreasing the length of pipe 108 to be 41 millimeters, increasing thickness of wall 110 to be 2.5 millimeters, using "T" shape connectors in positions of connectors 602 as shown in FIG. 6B, and increasing thickness of the connectors to be 1.5 millimeters.

As another example, in some embodiments, the natural frequency f of ion pump 104 may be further increased to 100 Hz by uniting flange 106 and pipe 108, further increasing the thickness of pipe 108 to be 3.1 millimeters, further decreasing the length of pipe 108 to be 38 millimeters, using inner and outer welding for the connection between pipe 108 and wall 110, further increasing the thickness of wall 110 to be 5.5 millimeters, adding plate 510 with thickness of 3 millimeters to pipe 108, and using "T" shape connectors with thickness of 3 millimeters in positions of connectors 602 as shown in FIG. 6B.

As another example, in some embodiments, the natural frequency f of ion pump 104 may be further increased to 150 Hz by uniting flange 106 and pipe 108, further increasing the thickness of pipe 108 to be 4.6 millimeters, further decreasing the length of pipe 108 to be 35 millimeters, using inner and outer welding for the connection between pipe 108 and wall 110, further increasing the thickness of wall 110 to be 8.5 millimeters, adding plate 510 with thickness of 6 millimeters to pipe 108, and using "T" shape connectors with thickness of 3 millimeters in positions of connectors 602 and regions 604 and 606 as shown in FIG. 6B.

As another example, in some embodiments, the natural frequency f of ion pump 104 may be further increased to 200 Hz by uniting flange 106 and pipe 108, further increasing the thickness of pipe 108 to be 7.1 millimeters, further decreasing the length of pipe 108 to be 30 millimeters, using inner and outer welding for the connection between pipe 108 and wall 110, further increasing the thickness of wall 110 to be 13.5 millimeters, adding plate 510 with thickness of 11 millimeters to pipe 108, and using "T" shape connectors with thickness of 9 millimeters in positions of connectors 602 and regions 604 and 606 as shown in FIG. 6B.

Figure 7:
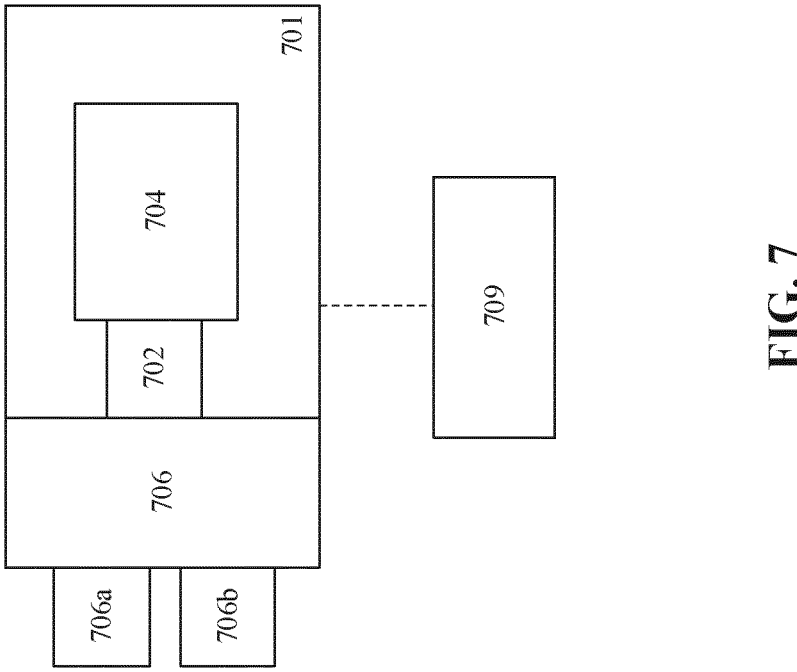
FIG. 7 is a schematic diagram illustrating an example charged-particle beam inspection system, consistent with some embodiments of the present disclosure.

In some embodiments, machine 102 may be a charged-particle beam inspection system, and ion pump 104 may be connected to a vessel of the charged-particle beam inspection system for providing vacuum. FIG. 7 illustrates an example charged-particle beam inspection system 700 consistent with some embodiments of the present disclosure. System 700 may be used for imaging. As shown in FIG. 7, system 700 includes a main chamber 701, a load/lock chamber 702, a beam tool 704, and an equipment front end module (EFEM) 706. Beam tool 704 is located within main chamber 701. EFEM 706 includes a first loading port 706a and a second loading port 706b. EFEM 706 may include additional loading port(s). First loading port 706a and second loading port 706b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 706 may transport the wafers to load/lock chamber 702. Load/lock chamber 702 is connected to a load/lock vacuum pump system (not shown) which removes gas molecules in load/lock chamber 702 to reach a first pressure below the atmospheric pressure. After reaching the first pressure, one or more robotic arms (not shown) may transport the wafer from load/lock chamber 702 to main chamber 701. Main chamber 701 is connected to a main chamber vacuum pump system (not shown) which removes gas molecules in main chamber 701 to reach a second pressure below the first pressure. After reaching the second pressure, the wafer is subject to inspection by beam tool 704. Beam tool 704 may be a single-beam system or a multi-beam system.

A controller 709 is electronically connected to beam tool 704. Controller 709 may be a computer configured to execute various controls of system 700. While controller 709 is shown in FIG. 7 as being outside of the structure that includes main chamber 701, load/lock chamber 702, and EFEM 706, it is appreciated that controller 709 may be a part of the structure.

In some embodiments, controller 709 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 709 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 8:
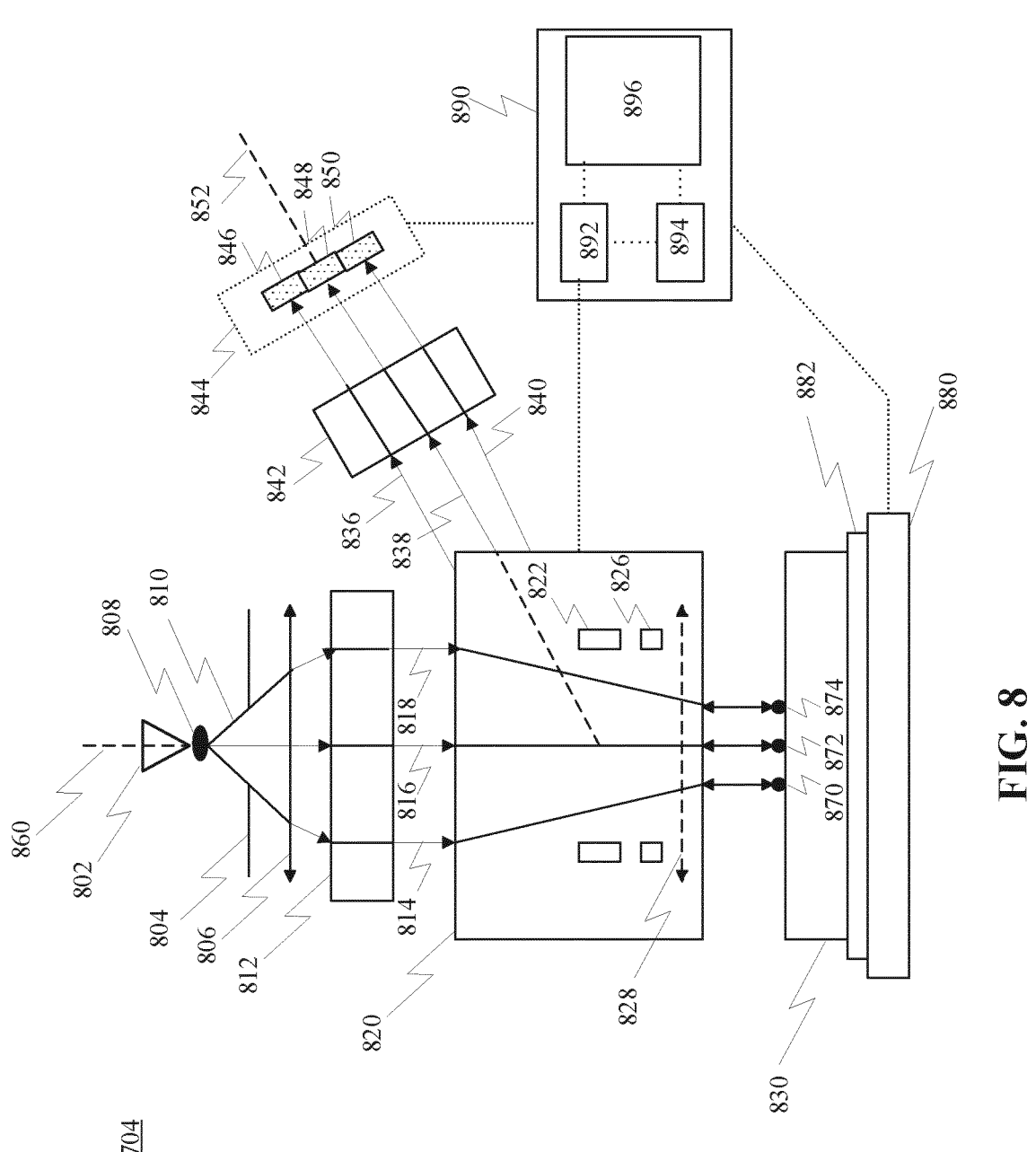
FIG. 8 is a schematic diagram illustrating an example multi-beam beam tool, consistent with some embodiments of the present disclosure that can be a part of the example system of FIG. 7.

FIG. 8 illustrates a schematic diagram of an example multi-beam beam tool 704 (also referred to herein as apparatus 704) and an image processing system 890 that may be configured for use in system 700 (FIG. 7), consistent with some embodiments of the present disclosure.

Beam tool 704 comprises an charged-particle source 802, a gun aperture 804, a condenser lens 806, a primary charged-particle beam 810 emitted from charged-particle source 802, a source conversion unit 812, a plurality of beamlets 814, 816, and 818 of primary charged-particle beam 810, a primary projection optical system 820, a motorized wafer stage 880, a wafer holder 882, multiple secondary charged-particle beams 836, 838, and 840, a secondary optical system 842, and an charged-particle detection device 844. Primary projection optical system 820 can comprise a beam separator 822, a deflection scanning unit 826, and an objective lens 828. Charged-particle detection device 844 can comprise detection sub-regions 846, 848, and 850.

Charged-particle source 802, gun aperture 804, condenser lens 806, source conversion unit 812, beam separator 822, deflection scanning unit 826, and objective lens 828 can be aligned with a primary optical axis 860 of apparatus 704. Secondary optical system 842 and charged-particle detection device 844 can be aligned with a secondary optical axis 852 of apparatus 704.

Charged-particle source 802 can emit one or more charged particles, such as electrons, protons, ions, muons, or any other particle carrying electric charges. In some embodiments, charged-particle source 802 may be an electron source. For example, charged-particle source 802 may include a cathode, an extractor, or an anode, wherein primary electrons can be emitted from the cathode and extracted or accelerated to form primary charged-particle beam 810 (in this case, a primary charged-particle beam) with a crossover (virtual or real) 808. For ease of explanation without causing ambiguity, electrons are used as examples in some of the descriptions herein. However, it should be noted that any charged particle may be used in any embodiment of this disclosure, not limited to electrons. Primary charged-particle beam 810 can be visualized as being emitted from crossover 808. Gun aperture 804 can block off peripheral charged particles of primary charged-particle beam 810 to reduce Coulomb effect. The Coulomb effect may cause an increase in size of probe spots.

Source conversion unit 812 can comprise an array of image-forming elements and an array of beam-limit apertures. The array of image-forming elements can comprise an array of micro-deflectors or micro-lenses. The array of image-forming elements can form a plurality of parallel images (virtual or real) of crossover 808 with a plurality of beamlets 814, 816, and 818 of primary charged-particle beam 810. The array of beam-limit apertures can limit the plurality of beamlets 814, 816, and 818. While three beamlets 814, 816, and 818 are shown in FIG. 8, embodiments of the present disclosure are not so limited. For example, in some embodiments, the apparatus 704 may be configured to generate a first number of beamlets. In some embodiments, the first number of beamlets may be in a range from 1 to 1000. In some embodiments, the first number of beamlets may be in a range from 200-500. In an example embodiment, an apparatus 704 may generate 400 beamlets.

Condenser lens 806 can focus primary charged-particle beam 810. The electric currents of beamlets 814, 816, and 818 downstream of source conversion unit 812 can be varied by adjusting the focusing power of condenser lens 806 or by changing the radial sizes of the corresponding beam-limit apertures within the array of beam-limit apertures. Objective lens 828 can focus beamlets 814, 816, and 818 onto a wafer 830 for imaging, and can form a plurality of probe spots 870, 872, and 874 on a surface of wafer 830.

Beam separator 822 can be a beam separator of Wien filter type generating an electrostatic dipole field and a magnetic dipole field. In some embodiments, if they are applied, the force exerted by the electrostatic dipole field on a charged particle (e.g., an electron) of beamlets 814, 816, and 818 can be substantially equal in magnitude and opposite in a direction to the force exerted on the charged particle by magnetic dipole field. Beamlets 814, 816, and 818 can, therefore, pass straight through beam separator 822 with zero deflection angle. However, the total dispersion of beamlets 814, 816, and 818 generated by beam separator 822 can also be non-zero. Beam separator 822 can separate secondary charged-particle beams 836, 838, and 840 from beamlets 814, 816, and 818 and direct secondary charged-particle beams 836, 838, and 840 towards secondary optical system 842.

Deflection scanning unit 826 can deflect beamlets 814, 816, and 818 to scan probe spots 870, 872, and 874 over a surface area of wafer 830. In response to the incidence of beamlets 814, 816, and 818 at probe spots 870, 872, and 874, secondary charged-particle beams 836, 838, and 840 may be emitted from wafer 830. Secondary charged-particle beams 836, 838, and 840 may comprise charged particles (e.g., electrons) with a distribution of energies. For example, secondary charged-particle beams 836, 838, and 840 may be secondary charged-particle beams including secondary electrons (energies ≤50 eV) and backscattered electrons (energies between 50 eV and landing energies of beamlets 814, 816, and 818). Secondary optical system 842 can focus secondary charged-particle beams 836, 838, and 840 onto detection sub-regions 846, 848, and 850 of charged-particle detection device 844. Detection sub-regions 846, 848, and 850 may be configured to detect corresponding secondary charged-particle beams 836, 838, and 840 and generate corresponding signals (e.g., voltage, current, etc.) used to reconstruct an image of surface area of wafer 830.

The generated signals may represent intensities of secondary charged-particle beams 836, 838, and 840 and may provide the signals to image processing system 890 in communication with charged-particle detection device 844, primary projection optical system 820, and motorized wafer stage 880. The movement speed of motorized wafer stage 880 may be adjusted to adjust the time intervals between consecutive beam scans of an area on wafer 830. The time intervals may need to be adjusted due to different materials on wafer 830 having different resistance-capacitance characteristics, thereby exhibiting varying sensitivity to imaging timing.

The intensity of secondary charged-particle beams 836, 838, and 840 may vary in accordance with the external or internal structure of wafer 830, and thus may indicate whether wafer 830 includes defects. Moreover, as discussed above, beamlets 814, 816, and 818 may be projected onto different locations of the top surface of wafer 830, or different sides of wafer 830 at a particular location, to generate secondary charged-particle beams 836, 838, and

840 of different intensities. Therefore, by mapping the intensity of secondary charged-particle beams 836, 838, and 840 with the areas of wafer 830, image processing system 890 may reconstruct an image that reflects the characteristics of internal or external structures of wafer 830.

In some embodiments, image processing system 890 may include an image acquirer 892, a storage 894, and a controller 896. Image acquirer 892 may comprise one or more processors. For example, image acquirer 892 may comprise a computer, server, mainframe host, terminals, personal computer, any kind of mobile computing devices, and the like, or a combination thereof. Image acquirer 892 may be communicatively coupled to charged-particle detection device 844 of beam tool 704 through a medium such as an electric conductor, optical fiber cable, portable storage media, IR, Bluetooth, internet, wireless network, wireless radio, or a combination thereof. In some embodiments, image acquirer 892 may receive a signal from charged-particle detection device 844 and may construct an image. Image acquirer 892 may thus acquire images of wafer 830. Image acquirer 892 may also perform various post-processing functions, such as generating contours, superimposing indicators on an acquired image, and the like. Image acquirer 892 may be configured to perform adjustments of brightness and contrast of acquired images. In some embodiments, storage 894 may be a storage medium such as a hard disk, flash drive, cloud storage, random access memory (RAM), other types of computer-readable memory, and the like. Storage 894 may be coupled with image acquirer 892 and may be used for saving scanned raw image data as original images, and post-processed images. Image acquirer 892 and storage 894 may be connected to controller 896. In some embodiments, image acquirer 892, storage 894, and controller 896 may be integrated together as one control unit.

In some embodiments, image acquirer 892 may acquire one or more images of a wafer based on an imaging signal received from charged-particle detection device 844. An imaging signal may correspond to a scanning operation for conducting charged particle imaging. An acquired image may be a single image including a plurality of imaging areas. The single image may be stored in storage 894. The single image may be an original image that may be divided into a plurality of regions. Each of the regions may comprise one imaging area containing a feature of wafer 830. The acquired images may comprise multiple images of a single imaging area of wafer 830 sampled multiple times over a time sequence. The multiple images may be stored in storage 894. In some embodiments, image processing system 890 may be configured to perform image processing steps with the multiple images of the same location of wafer 830.

In some embodiments, image processing system 890 may include measurement circuitries (e.g., analog-to-digital converters) to obtain a distribution of the detected secondary charged particles (e.g., secondary electrons). The charged-particle distribution data collected during a detection time window, in combination with corresponding scan path data of beamlets 814, 816, and 818 incident on the wafer surface, can be used to reconstruct images of the wafer structures under inspection. The reconstructed images can be used to reveal various features of the internal or external structures of wafer 830, and thereby can be used to reveal any defects that may exist in the wafer.

In some embodiments, the charged particles may be electrons. When electrons of primary charged-particle beam 810 are projected onto a surface of wafer 830 (e.g., probe spots 870, 872, and 874), the electrons of primary charged-particle beam 810 may penetrate the surface of wafer 830 for a certain depth, interacting with particles of wafer 830. Some electrons of primary charged-particle beam 810 may elastically interact with (e.g., in the form of elastic scattering or collision) the particles of wafer 830 and may be reflected or recoiled out of the surface of wafer 830. An elastic interaction conserves the total kinetic energies of the bodies (e.g., electrons of primary charged-particle beam 810 and particles of wafer 830) of the interaction, in which the kinetic energy of the interacting bodies does not convert to other forms of energy (e.g., heat, electromagnetic energy, etc.). Such reflected electrons generated from elastic interaction may be referred to as backscattered electrons (BSEs). Some electrons of primary charged-particle beam 810 may inelastically interact with (e.g., in the form of inelastic scattering or collision) the particles of wafer 830. An inelastic interaction does not conserve the total kinetic energies of the bodies of the interaction, in which some or all of the kinetic energy of the interacting bodies convert to other forms of energy. For example, through the inelastic interaction, the kinetic energy of some electrons of primary charged-particle beam 810 may cause electron excitation and transition of atoms of the particles. Such inelastic interaction may also generate electrons exiting the surface of wafer 830, which may be referred to as secondary electrons (SEs). Yield or emission rates of BSEs and SEs depend on, e.g., the material under inspection and the landing energy of the electrons of primary charged-particle beam 810 landing on the surface of the material, among others. The energy of the electrons of primary charged-particle beam 810 may be imparted in part by its acceleration voltage (e.g., the acceleration voltage between the anode and cathode of charged-particle source 802 in FIG. 8). The quantity of BSEs and SEs may be more or fewer (or even the same) than the injected electrons of primary charged-particle beam 810.

The images generated by SEM may be used for defect inspection. For example, a generated image capturing a test device region of a wafer may be compared with a reference image capturing the same test device region. The reference image may be predetermined (e.g., by simulation) and include no known defect. If a difference between the generated image and the reference image exceeds a tolerance level, a potential defect may be identified. As another example, the SEM may scan multiple regions of the wafer, each region including a test device region designed as the same, and generate multiple images capturing those test device regions as manufactured. The multiple images may be compared with each other. If a difference between the multiple images exceeds a tolerance level, a potential defect may be identified.

In some embodiments, machine 102 may be beam tool 704, and many components of beam tool 704 may work in a vacuum environment. For example, a vessel (e.g., a column) of beam tool 704 may enclose at least one of charged-particle source 802, gun aperture 804, condenser lens 806, source conversion unit 812, primary projection optical system 820, beam separator 822, deflection scanning unit 826, objective lens 828, wafer 830, wafer holder 882, motorized wafer stage 880, secondary optical system 842, or charged-particle detection device 844. Ion pump 104 may be connected to the vessel of beam tool 704 and extract the gas therein for providing the vacuum. As previously described, by adding the damper or increasing the natural frequency of ion pump 104, the likelihood of the ion pump resonating with low-frequency environmental vibrations may be greatly reduced, and the inspection quality of beam tool 704 may be greatly improved.

Figure 9:
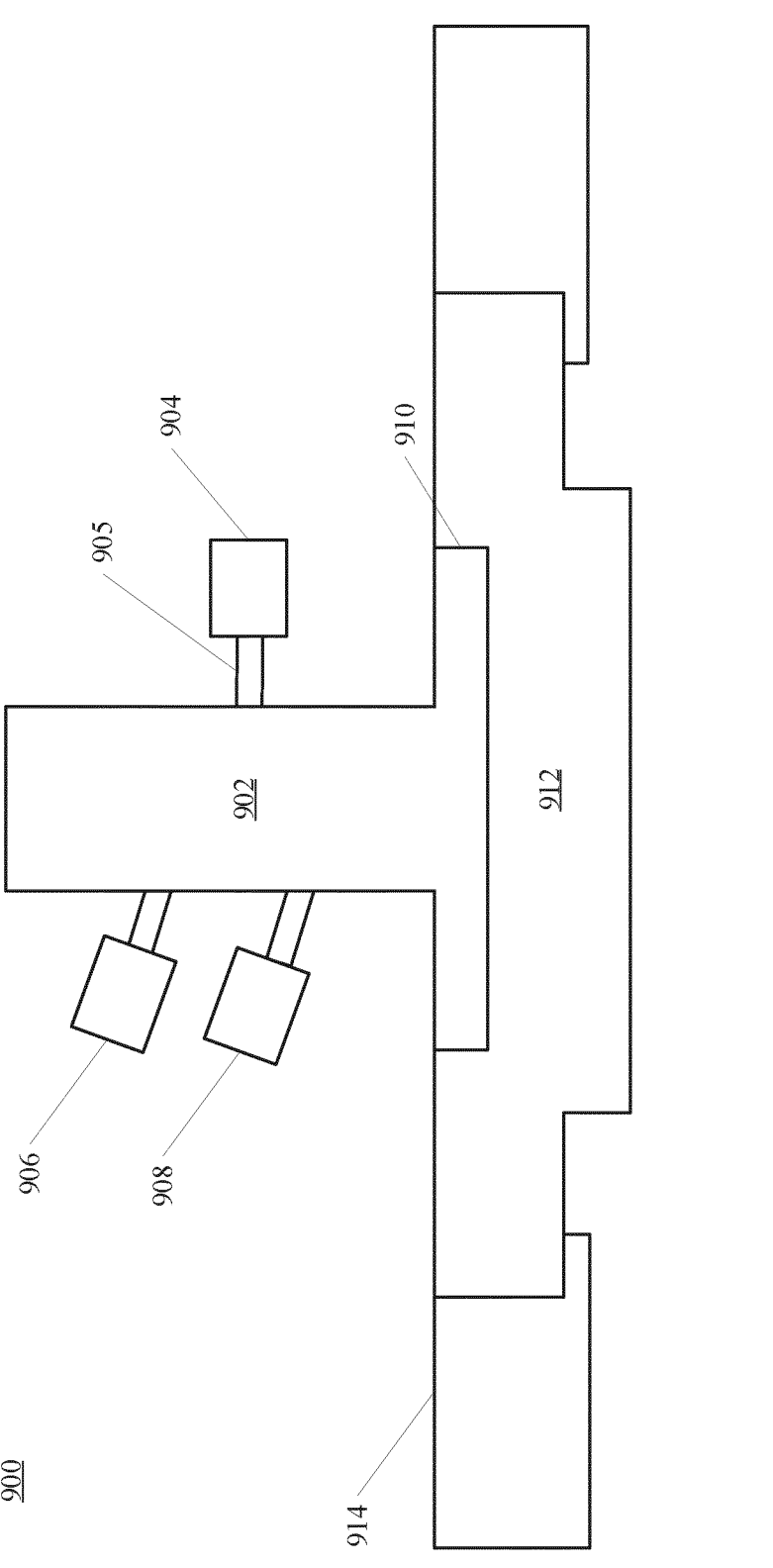
FIG. 9 is a schematic diagram illustrating an example of a system, consistent with some embodiments of the present disclosure.

FIG. 9 is a schematic diagram illustrating an example of a system 900, consistent with some embodiments of the present disclosure. System 900 may be part of a charged-particle inspection system (e.g., EBI system 700 in FIG. 7). In FIG. 9, system 900 includes a column 902 and pumps 904, 906, and 908 mounted on column 902. In some embodiments, column 902 may enclose gun aperture 804, condenser lens 806, source conversion unit 812, and primary projection optical system 820, which are shown and described in FIG. 8. Pumps 904, 906, and 908 may be mounted in any angle with respect to column 902 and may extract gas from column 902 to provide a vacuum therein. For example, pump 904 may be secured to column 902 via a tube 905. In some embodiments, pumps 904, 906, and 908 may be ion pumps (e.g., ion pump 104 in FIG. 1C). In some embodiments, pumps 904, 906, and 908 may be part of the load/lock vacuum pump system as described in FIG. 7. Column 902 includes a flange portion 910, by which column 902 may be mounted (e.g., by one or more bolts or screws) to a metroframe 912 from the top. Metroframe 912 may be a movable component of a chamber top 914 that is a top portion of a chamber (e.g., load/lock chamber 702 in FIG. 7). In some embodiments, the chamber may enclose motorized wafer stage 880 and wafer holder 882, which are shown and described in FIG. 8.

In some embodiments, pump 904 may be ion pump 104 of FIG. 1C. Flange 106 of ion pump 104 may mate with tube 905 in FIG. 9, such as by bolts or screws. Referring back to FIG. 9, when metroframe 912 moves (e.g., in any horizontal direction), column 902 may be moved along with metroframe 912. Column 902 and metroframe 912 are not an ideal, integral rigid body due to the mounting (e.g., by bolts or screws through flange portion 910) between them. Due to acceleration and deceleration of metroframe 912, column 902 may be excited (e.g., driven by an external force) to vibrate. Pump 904 and tube 905 are not an ideal, integral rigid body, either, due to the connection (e.g., bolts or screws in flange 106) between them. In other words, the connection has a definite value of stiffness. When column 902 is excited to vibrate at an excitation frequency, such excitation vibration may be propagated to pumps 904, 906, and 908 and incur them to vibrate in response frequencies. Such response vibrations may in turn amplify the excitation vibration of column 902 and cause vibration-induced noise in a scan image generated by the charged-particle beam inspection system.

Figure 10:
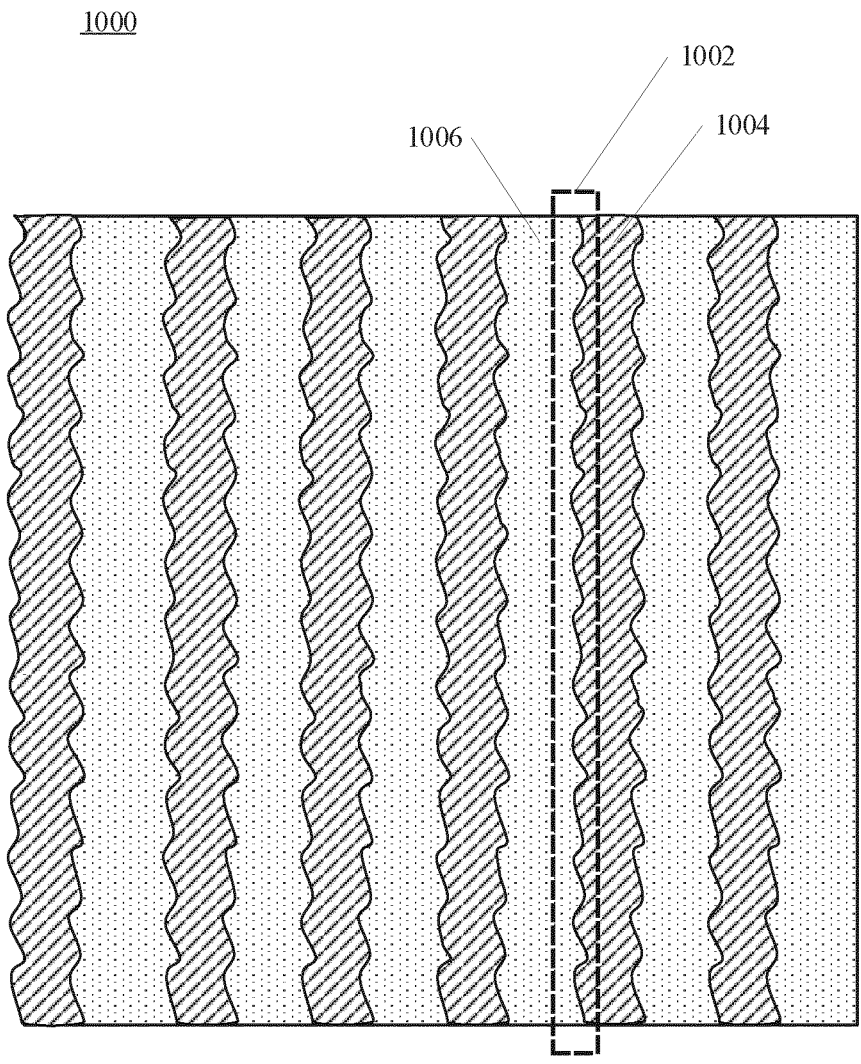
FIG. 10 illustrates an example of vibration-induced noise of a partial scan image generated by a charged-particle beam inspection apparatus, consistent with some embodiments of the present disclosure.

FIG. 10 illustrates an example of vibration-induced noise of a partial scan image 1000 generated by a charged-particle beam inspection apparatus, consistent with some embodiments of the present disclosure. The charged-particle beam inspection apparatus may be a single-beam beam tool or a multi-beam beam tool (e.g., multi-beam beam tool 704 in FIG. 8) of a charged-particle beam inspection system (e.g., system 900 in FIG. 9). For example, partial scan image 1000 may be a portion of a scan image generated by charged-particle detection device 844 of FIG. 8. In FIG. 10, partial scan image 1000 includes a feature 1002. Feature 1002 may be a boundary between regions 1004 and 1006, which may correspond to two circuit geometries having a straight-line boundary. Ideally, the boundary line in feature 1002 may be a straight line. However, due to the vibration of column 902 of FIG. 9, feature 1002 shows a jagged line, which is the vibration-induced noise (also referred to as point-of-interest error). The oscillation period of the jagged line may reflect the frequency of the vibration of column 902.

This disclosure provides apparatuses, systems, and methods that may dampen the vibration of column 902. In some of those designs, a damping element (e.g., a viscous damper) may be coupled to pump 904, and pump 904 and the damping element may form a mass-based damper (e.g., a tuned mass damper, a skyhook damper, an active-mass damper, etc.) for attenuating the vibration of column 902. By doing so, the vibration-induced noise (e.g., the jagged line in feature 1002) may be reduced, and the damping of the vibrations can be adapted for different applications.

Figure 11:
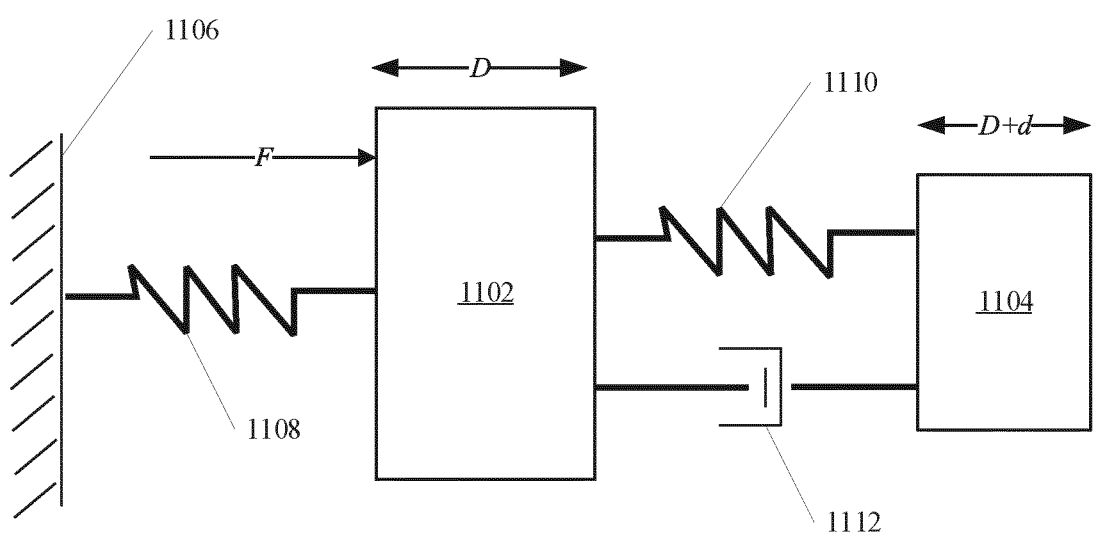
FIG. 11 illustrates an example charged-particle beam inspection apparatus having a tuned mass damper coupled to a column, consistent with some embodiments of the present disclosure.

FIG. 11 illustrates an example charged-particle beam inspection apparatus 1100 having a tuned mass damper coupled to a column, consistent with some embodiments of the present disclosure. Apparatus 1100 includes a column 1102 and a pump 1104. For example, column 1102 may be similar to column 902 in FIG. 9, and pump 1104 may be similar to pump 904 in FIG. 9. When a bottom portion of column 1102 is mounted on a base (not shown in FIG. 11) with its top portion free to move (e.g., similar to column 902 mounted to metroframe 912 in FIG. 9), column 1102 may have a degree of freedom to oscillate left and right (represented by displacement D in FIG. 11). Such an oscillation may be abstracted by column 1102 being coupled to wall 1106 via a primary spring 1108. Pump 1104 is mounted to column 1102 (e.g., similar to pump 904 mounted to column 902 in FIG. 9) and may have a degree of freedom to oscillate left and right (represented by displacement D+d in FIG. 11 in which d represents a relative displacement of pump 1104 with respect to column 902). Such an oscillation may be abstracted by pump 1104 being coupled to column 1102 via a secondary spring 1110. A damping element 1112 is provided between column 1102 and pump 1104. In some embodiments, damping element 1112 may be a viscous damping element (e.g., a rubber, viton, or the like).

In FIG. 11, primary spring 1108 may have an elastic coefficient (or "stiffness") k1, the value of which may reflect the stiffness of the connection (e.g., bolts or screws in flange portion 910 of FIG. 9) between column 1102 and the base. Secondary spring 1110 may have an elastic coefficient (or "stiffness") k2, the value of which may reflect the stiffness of the connection (e.g., bolts or screws in flange 106 of FIG. 1C) between column 1102 and pump 1104. Damping element 1112 (e.g., a rubber piece) may have a damping ratio the value of which may be adjusted by changing dynamic characteristics (e.g., a shape, a dimension, a Young's modulus, stiffness, or a material) of damping element 1112.

When column 1102 is moved (e.g., by moving the base where column 1102 is mounted), due to acceleration or deceleration, column 1102 may be excited (or "forced") to vibrate. Such a vibration may be referred to as a "response vibration," the dynamics of which may be abstracted by asserting an excitation force F onto column 1102, as shown in FIG. 11. Pump 1104, secondary spring 1110, and damping element 1112 may form a tuned mass damper, which may attenuate an amplitude of the response vibration of column 1102. Assuming column 1102 has a mass m1 and pump 1104 has a mass $m_2$, in principle, the equations of motion for column 1102 and pump 1104 may be expressed by:

$$m_1\ddot{D}+c\dot{D}+(k_1+k_2)D=F+k_2d+c\dot{d} \qquad \text{Eq. (2)}$$

$$m_2\ddot{d}+c\dot{d}+k_2d=c\dot{D}+k_2D \qquad \text{Eq. (3)}$$

In Eq. (2), c is the damping coefficient of damping element 1112, expressed by:

$$\omega_2=\sqrt{k_2/m_2}=f_2/2\pi \qquad \text{Eq. (4)}$$

$$c=2\xi\omega_2m_2=2\xi\sqrt{k_2m_2} \qquad \text{Eq. (5)}$$

where $f_2$ is the natural frequency of pump 1104 oscillating under secondary spring 1110. For example, $f_2$ may be around 35 Hz.

Assuming the excitation force F has a period of 0, D and d may respond as:

$$F=\overline{F}e^{i\Omega t} \qquad \text{Eq. (6)}$$

$$D=\overline{D}e^{i\Omega t} \qquad \text{Eq. (7)}$$

$$d=\overline{d}e^{i\Omega t} \qquad \text{Eq. (8)}$$

where $\overline{F}$ is the amplitude of F, $\overline{D}$ is the amplitude of D, and $\overline{d}$ is the amplitude of d. Substituting Eqs. (3) to (7) into Eq. (1) and (2), $\overline{D}$ and $\overline{d}$ may be solved. In some embodiments, the solutions of $\overline{D}$ and $\overline{d}$ may depend on the following parameters:

$$\omega_1 = \sqrt{k_1/m_1} = f_1/2\pi \qquad \text{Eq. (9)}$$

$$f = \frac{\omega_2}{\omega_1} = \sqrt{\frac{k_2m_1}{k_1m_2}} \qquad \text{Eq. (10)}$$

$$\rho = \frac{\Omega}{\omega_1} = \Omega\sqrt{m_1/k_1} \qquad \text{Eq. (11)}$$

$$\overline{m} = \frac{m_2}{m_1} \qquad \text{Eq. (12)}$$

where $f_1$ is the natural frequency of column 1102 oscillating under primary spring 1108. For example, $f_1$ may be between 80-100 Hz (e.g., 85 Hz), which may be referred to as "decoupled" from the natural frequency $f_2$ of pump 1104.

In some embodiments, by minimizing $\overline{D}$ (e.g., minimizing the real component of $\overline{D}$), the amplitude of the response vibration of column 1102 may be attenuated. For a specific application of the charged-particle inspection apparatus, m1 and k1 may be fixed for column 1102 and primary spring 1108, m2 and k2 may be fixed for pump 1104 and secondary spring 1108, and $\Omega$ may be fixed for the excitation force F. Therefore, $\overline{D}$ may depend on the damping ratio $\zeta$ of damping element 1112. In other words, $\overline{D}$ may be reduced by adjusting $\zeta$. In some embodiments, $\zeta$ may be adjusted by changing a dynamic or material characteristic of damping element 1112, such as, for example, a shape, a dimension, a Young's modulus, stiffness, or a material. For example, for a specific application, if the goal is to reduce the amplitude of the response vibration of column 1102 by a percentage (e.g., 95%), at least one dynamic characteristic (e.g., a thickness) of damping element 1112 may be selected, adjusted, or tuned, until $\overline{D}$ is reduced by 95%.

In some embodiments, when $\zeta$ has a value $\zeta^{min}$, $\overline{D}$ (e.g., the real component of $\overline{D}$) may be minimized to a minimum value $$H_D^{min}.$$

For example, for any $\zeta$ being greater or smaller than $\zeta^{min}$, $H_D$ may have a value greater than its minimum value $$H_D^{min}.$$

In some embodiments, $\zeta^{min}$ and $$H_D^{min}$$

may only depend on the mass ratio $\overline{m}$ in Eq. (12).

In some embodiments, for a specific application of the charged-particle inspection apparatus, $m_1$ and $k_1$ may be adjustable for column 1102 and primary spring 1108, and $m_2$ and $k_2$ may be adjustable for pump 1104 and secondary spring 1108. For example, k1 may be adjusted by reinforcing or loosening the connection between column 1102 and the base (e.g., metroframe 912 in FIG. 9) it mounts on. In another example, k2 may be adjusted by reinforcing or loosening the connection between column 1102 and pump 1104, or by adjusting damping element 1112, or both. In another example, m1 and m2 may be adjusted by adding weight (e.g., a metal block) to column 1102 and pump 1104, respectively, or by reducing weight of components of column 1102 and pump 1104, respectively. By adjusting m1, k1, m2, and k2, $\overline{D}$ may be attenuated in a wider range for different applications of the charged-particle inspection apparatus.

It should be noted that FIG. 11 only shows a one-dimensional model, in which the excitation force F and the movements of column 1102 and pump 1104 are also one-dimensional. In some embodiments, the excitation force F may be two-dimensional (e.g., having both x- and y-components), and the response vibration of column 1102 may be two-dimensional, and the movement of pump 1104 may be two-dimensional or even three-dimensional. In principle, the response vibration of column 1102 may be determined by decomposing F in the x- and y-directions for determining the x- and y-component of the response vibration independently. In some embodiments, either of the x- and y-amplitude of the response vibration of column 1102 may also depend on the damping ratio $\zeta$ of damping element 1112. By changing one or more dynamic or material characteristics of damping element 1112, both of the x- and y-amplitude of the response vibration of column 1102 may be reduced or minimized (e.g., similar to an analysis as described in association with Eqs. (2) to (12)). In some embodiments, the dynamic or material characteristics of damping element 1112 may be anisotropic.

It should also be noted that, depending on different assumptions and preconditions, the response vibration of column 1102 may be analyzed in a way different from the description associated with Eqs. (2) to (12), which are only examples and are not limited by this disclosure.

Figure 12:
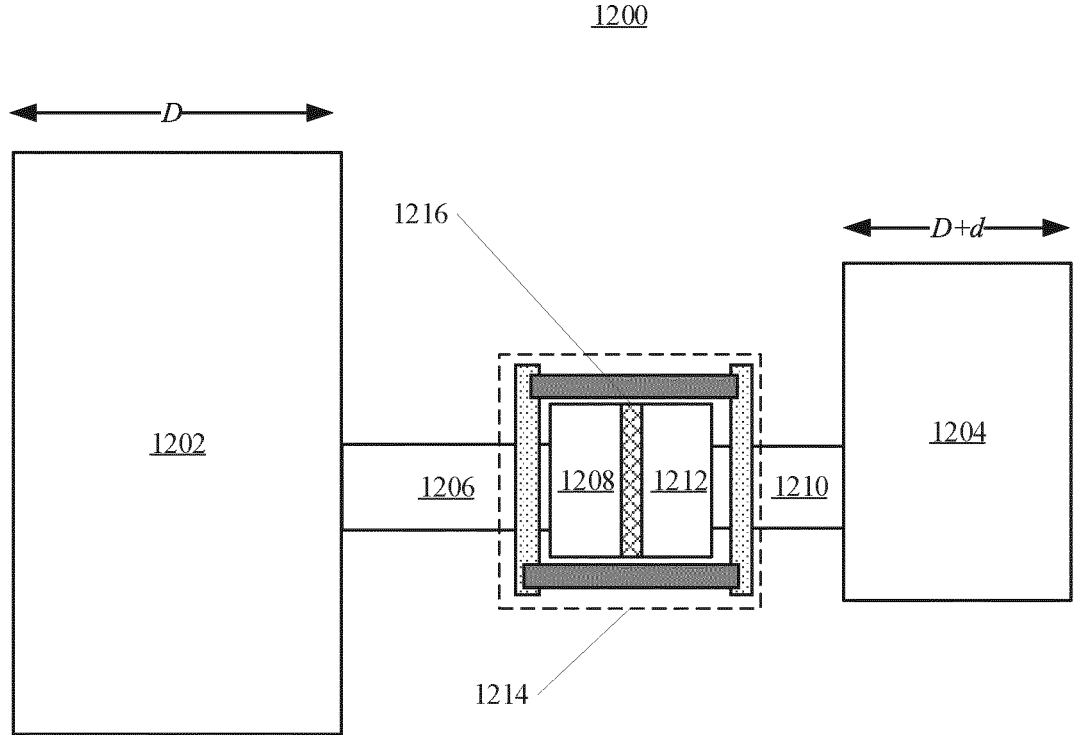
FIG. 12 is a schematic diagram illustrating an example of a tuned mass damper coupled to a column of a charged-particle beam inspection apparatus, consistent with some embodiments of the present disclosure.

FIG. 12 is a schematic diagram illustrating an example of a tuned mass damper coupled to a column of a charged-particle beam inspection apparatus 1200, consistent with some embodiments of the present disclosure. Apparatus 1200 may be an implementation of apparatus 1100. Apparatus 1200 includes a column 1202 and a pump 1204. Column 1202 may include a tube 1206 extending from a wall of column 1202. A flange 1208 may be arranged at an end of tube 1206. Pump 1204 may include a pipe 1210 (e.g., similar to pipe 108 in FIG. 1C) extending from its wall (e.g., similar to wall 110 in FIG. 1C). A flange 1212 (e.g., similar to flange 106 in FIG. 1C) may be arranged at an end of the pipe.

Flanges 1208 and 1212 may be secured by a connector 1214 (shown as being enclosed by a dashed-line box). For example, as shown in FIG. 12, connector 1214 may include bolts (shown as gray boxes), screws (not shown), and clamps (shown as dotted boxes). Connector 1214 may join flanges 1208 and 1212 with an airtight seal. It should be noted that connector 1214 may include any number of any type of fixtures or fasteners for securing or mating flanges 1208 and 1212, and the type of fixtures or fasteners for securing or mating flanges 1208 and 1212 is not limited by this disclosure.

In FIG. 12, a damping element 1216 may be provided between pump 1204 and connector 1214, such as between flanges 1208 and 1212. For example, damping element 1216 may be a viscous damper (e.g., a rubber damper, a viton damper, or the like). In FIG. 12, pump 1204 (including pipe 1210 and flange 1212), connector 1214, and damping element 1216 may form a tuned mass damper, of which pump 1204 may form a mass component (similar to pump 1104 in FIG. 11), connector 1214 and damping element 1216 may form an elastic component (similar to secondary spring 1110 in FIG. 11), and damping element 1216 may form a damping component (similar to damping element 1112 in FIG. 11).

In some embodiments, when a bottom portion of column 1202 is mounted on a base (not shown in FIG. 12) with its top portion free to move (e.g., similar to column 902 mounted to metroframe 912 in FIG. 9), column 1202 may have a degree of freedom to vibrate (e.g., the response vibration) left and right (represented by displacement D in FIG. 12), and pump 1204 may have a degree of freedom to vibrate left and right (represented by displacement D+d in FIG. 12). In some embodiments (e.g., similar to an analysis as described in association with Eqs. (2) to (12)), one or more dynamic or material characteristics of damping element 1216 may be selected, adjusted, or tuned such that an amplitude of the response vibration of column 1202 may be reduced or minimized. The analysis of the response vibration of column 1202 may be similar to the analysis of the response vibration of column 1102 in FIG. 11, and will not be repeated hereinafter.

Figure 13:
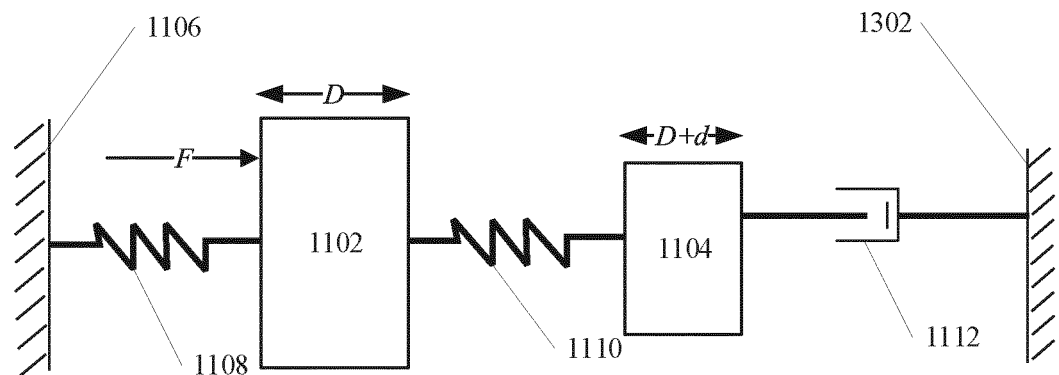
FIG. 13 illustrates an example charged-particle beam inspection apparatus having a skyhook damper coupled to a column, consistent with some embodiments of the present disclosure.

FIG. 13 illustrates an example charged-particle beam inspection apparatus 1300 having a skyhook damper coupled to a column, consistent with some embodiments of the present disclosure. Apparatus 1300 may be similar to apparatus 1100 and include similar components, except that damping element 1112 is arranged not between column 1102 and pump 1104. Instead, damping element 1112 is arranged between pump 1104 and a ceiling 1302. In other words, the movement of pump 1104 is not a free-end damping movement, but a confined damping movement, in which damping element 1112 may be referred to as a "skyhook" damping element. In FIG. 13, pump 1104, secondary spring 1110, and damping element 1112 may form a skyhook damper.

By analyzing the equations of motion of column 1102 and pump 1104, factors defining amplifications of pseudo-static responses of D and d under the excitation force F may be derived. In some embodiments, such factors may be a function depending on the damping ratio of damping element 1112. By adjusting (e.g., by changing a dynamic or material characteristic of damping element 1112, such as, for example, a shape, a dimension, a Young's modulus, stiffness, or a material), the amplitude of the response vibration of column 1102 may be reduced or minimized. In some embodiments, such adjustment of may be performed under a condition that the natural frequency of pump 1104 being decoupled to (e.g., lower than) the natural frequency of column 1102.

Compared with the tuned mass damper as shown and described in FIGS. 11-12, the skyhook damper may provide a broader adjustment range of which may accommodate a broader range of applications of the charged-particle inspection apparatus (e.g., apparatus 1300). In some embodiments, the minimum amplitude of the response vibration of column 1102 in FIG. 13 may depend on a ratio between the mass of column 1102 and the mass of pump 1104.

Figure 14:
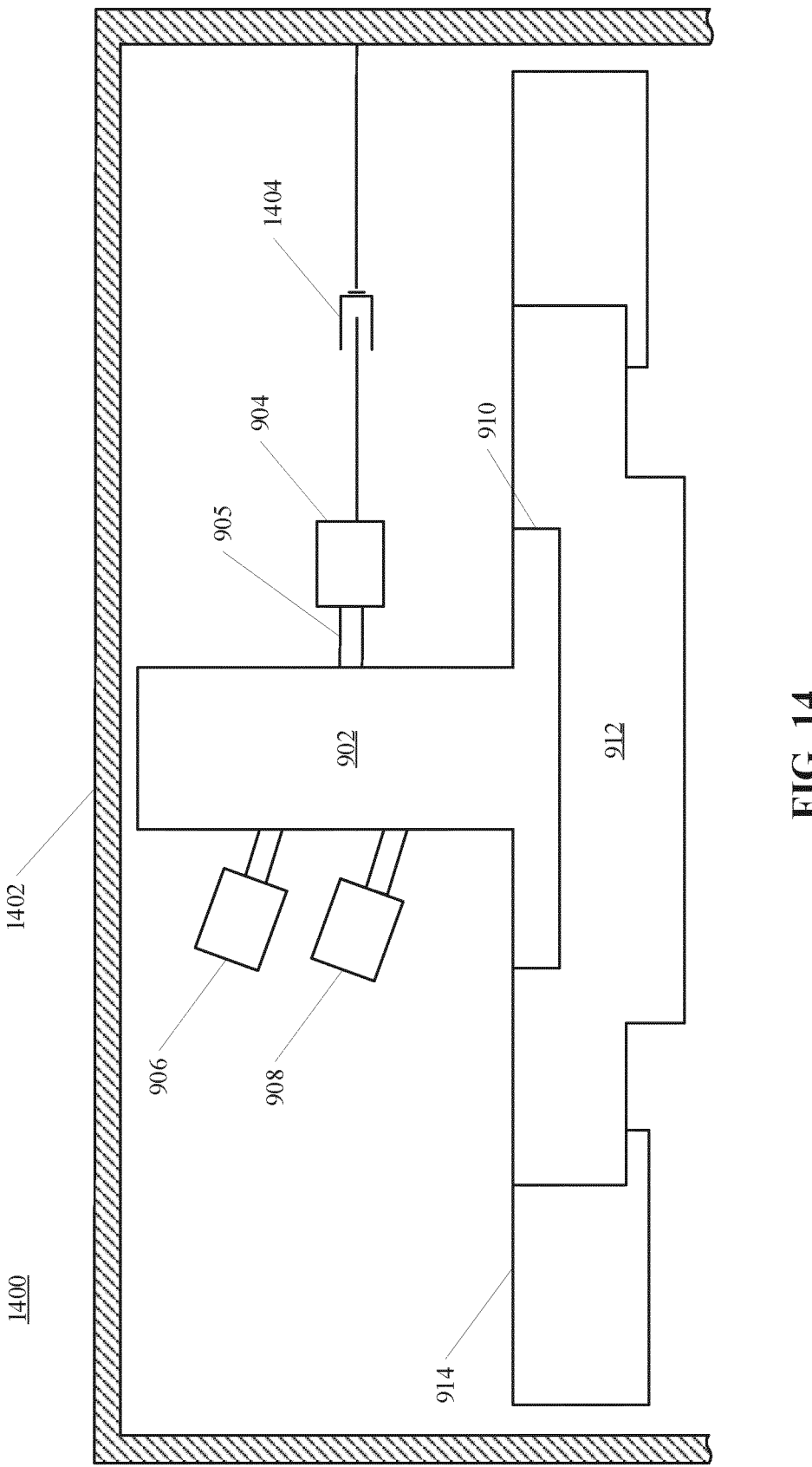
FIG. 14 is a schematic diagram illustrating an example of a skyhook damper coupled to a column of a charged-particle beam inspection system, consistent with some embodiments of the present disclosure.

FIG. 14 is a schematic diagram illustrating an example of a skyhook damper coupled to a column of a charged-particle beam inspection system 1400, consistent with some embodiments of the present disclosure. Compared with FIG. 9, system 1400 includes a chamber 1402 (e.g., similar to main chamber 701 in FIG. 7) that encloses system 900. A damping element 1404 is arranged between pump 904 and a wall of chamber 1402. For example, damping element 1404 may be a hydraulic damping element. In FIG. 14, pump 904, a connector (not shown, can be similar to connector 1214 in FIG. 12) between pump 904 and column 902, and damping element 1404 may form a skyhook damper, of which pump 904 may form a mass component (similar to pump 1104 in FIG. 13), the connector and damping element 1404 may form an elastic component (similar to secondary spring 1110 in FIG. 13), and damping element 1404 may form a damping component (similar to damping element 1112 in FIG. 13).

In FIG. 14, column 902 may have a degree of freedom to vibrate (e.g., the response vibration) left and right when metroframe 912 moves (e.g., moving in a horizontal direction), and pump 904 may have a degree of freedom to vibrate left and right. One or more dynamic or material characteristics of damping element 1404 may be selected, adjusted, or tuned such that an amplitude of the response vibration of column 902 may be reduced or minimized. The analysis of the response vibration of column 902 in FIG. 14 may be similar to the analysis of the response vibration of column 1102 in FIG. 13, and will not be repeated hereinafter.

In some embodiments, in FIGS. 11-14, the damping element (e.g., damping element 1112, 1216, or 1404) may be an active damping element rather than a viscous damping element. Correspondingly, the damper formed by the pump (e.g., pump 1104, 1204, or 904), the connection (e.g., connector 1214) between the pump and the column (e.g., column 1102, 1202, or 902), and the damping element may be an active-mass damper. For example, the damping element may include a sensor (e.g., an accelerometer) and an actuator (e.g., a motor), both being coupled to the pump. Circuitry (e.g., controller 709 in FIG. 7) may be communicatively coupled to the sensor and the actuator for receiving data from the sensor and controlling the actuator.

In some embodiments, the circuitry may receive motion data from the sensor. The motion data may indicate a vibration (e.g., the response vibration) of the column. The motion data may also indicate a movement of the pump. Based on the motion data, the circuitry may determine a damping (e.g., a direction and amplitude of a damping force) for attenuating the amplitude of the vibration of the column. After determining the damping, the circuitry may actuate the actuator to react to the vibration of the column in accordance with the damping. By doing so, the amplitude of the vibration of the column may be reduced or minimized.

In some embodiments, the active-mass damper may further include a viscous damping element (e.g., a rubber damper, a viton damper, or the like) besides the sensor, the actuator, and the circuitry. The actuator and the viscous damping element may coordinate to dampen the vibration of the column. For example, similar to the above description, after receiving the motion data from the sensor, the circuitry may determine the damping based on the motion data and the damping ratio of the damping element. After determining the damping, the circuitry may actuate the actuator to react to the vibration of the column in accordance with the damping.

The embodiments may further be described using the following clauses:

1. An ion pump, comprising:
   a pump body comprising a wall, the wall comprising a first opening;
   a housing configured to hold the pump body;
   a T-shape connector configured to secure the pump body to the housing; and
   an inlet pipe connected to the first opening, comprising:
   a pipe portion having a first end portion, wherein the first end portion's outer surface is inside the first opening, and the first end portion is secured to the first opening on a first side of the wall inside the pump body and on an outer surface of the first end portion outside the pump body,
   a flange portion having a second opening, wherein the flange portion is secured to a second end portion of the pipe portion such that stiffness of connection of the flange portion and the second end portion is greater than or equal to 107 Newton Per Meter; and
   a feature configured to reinforce connection of the first end portion and the first opening, wherein the feature connects the outer surface of the first end portion to a second side of the wall outside the pump body such that stiffness of the connection of the first end portion and the first opening is greater than or equal to 107 Newton Per Meter.

2. The ion pump of clause 1, wherein the second opening is further configured to be connected to a vessel, wherein the ion pump is configured to generate a vacuum in the vessel.

3. The ion pump of any of clauses 1-2, wherein the housing comprises a pole piece of a magnet set.

4. The ion pump of any of clauses 1-3, wherein the T-shape connector is further configured to bolt the pump body to the housing.

5. The ion pump of any of clauses 1-4, further comprising a plurality of T-shape connectors configured to secure the pump body to the housing.

6. The ion pump of any of clauses 1-5, wherein thickness of the T-shape connector is greater than or equal to 3 millimeters.

7. The ion pump of any of clauses 1-6, wherein thickness of the T-shape connector is greater than or equal to 9 millimeters.

8. The ion pump of any of clauses 1-7, wherein the first end portion is welded to the first opening on the first side of the wall inside the pump body and on the outer surface of the first end portion outside the pump body.

9. The ion pump of any of clauses 1-8, wherein the inlet pipe and the wall are manufactured as an inseparable part.

10. The ion pump of any of clauses 1-9, wherein the inlet pipe is welded to the wall.

11. The ion pump of any of clauses 1-9, wherein the inlet pipe and the wall are cast as a single part.

12. The ion pump of any of clauses 1-11, wherein the pipe portion and the flange portion are manufactured as an inseparable part.

13. The ion pump of any of clauses 1-12, wherein the flange portion is welded to the pipe portion.

14. The ion pump of any of clauses 1-13, wherein the flange portion and the pipe portion are cast as a single part.

15. The ion pump of any of clauses 1-14, wherein thickness of a wall of the pipe portion is greater than or equal to 1.6 millimeters.

16. The ion pump of any of clauses 1-15, wherein thickness of a wall of the pipe portion is greater than or equal to 3.1 millimeters.

17. The ion pump of any of clauses 1-16, wherein thickness of a wall of the pipe portion is greater than or equal to 4.6 millimeters.

18. The ion pump of any of clauses 1-17, wherein thickness of a wall of the pipe portion is greater than or equal to 7.1 millimeters.

19. The ion pump of any of clauses 1-18, wherein thickness of the wall is greater than or equal to 2.5 millimeters.

20. The ion pump of any of clauses 1-19, wherein thickness of the wall is greater than or equal to 5.5 millimeters.

21. The ion pump of any of clauses 1-20, wherein thickness of the wall is greater than or equal to 8.5 millimeters.

22. The ion pump of any of clauses 1-21, wherein thickness of the wall is greater than or equal to 13.5 millimeters.

23. The ion pump of any of clauses 1-22, wherein the feature comprises one of a fillet, a chamfer, a plate, or a rib.

24. The ion pump of any of clauses 1-23, wherein the feature is a plate having a thickness greater than or equal to 3 millimeters.

25. The ion pump of any of clauses 1-24, wherein the feature is a plate having a thickness greater than or equal to 6 millimeters.

26. The ion pump of any of clauses 1-25, wherein the feature is a plate having a thickness greater than or equal to 11 millimeters.

27. The ion pump of any of clauses 1-26, wherein the feature is welded to the outer surface of the first end portion and the second side of the wall outside the pump body.

28. The ion pump of any of clauses 1-26, wherein the pipe portion is cast to have the feature at the first end portion, and the feature is welded to the second side of the wall outside the pump body.

29. The ion pump of any of clauses 1-28, wherein a length of the pipe portion is shorter than or equal to 41 millimeters.

30. The ion pump of any of clauses 1-29, wherein a length of the pipe portion is shorter than or equal to 38 millimeters.

31. The ion pump of any of clauses 1-30, wherein a length of the pipe portion is shorter than or equal to 35 millimeters.

32. The ion pump of any of clauses 1-31, wherein a length of the pipe portion is shorter than or equal to 30 millimeters.

33. The ion pump of any of clauses 1-32, wherein a natural frequency of the ion pump is greater than or equal to 150 Hz when the stiffness of connection of the flange portion and the second end portion is greater than or equal to 107 Newton Per Meter and the stiffness of the connection of the first end portion and the first opening is greater than or equal to 107 Newton Per Meter.

34. The ion pump of clause 33, wherein the natural frequency of the ion pump is greater than or equal to 40 Hz.

35. The ion pump of clause 33, wherein the natural frequency of the ion pump is greater than or equal to 100 Hz.

36. The ion pump of clause 33, wherein the natural frequency of the ion pump is greater than or equal to 150 Hz.

37. The ion pump of clause 33, wherein the natural frequency of the ion pump is greater than or equal to 200 Hz.

38. The ion pump of any of clauses 1-37, further comprising a damper attached to the flange portion opposite to the second end portion of the pipe portion, configured to attenuate vibration energy.

39. The ion pump of clause 38, wherein the damper comprises one of an elastic component or a flexible component.

40. The ion pump of any of clauses 38-39, wherein the damper comprises one of a rubber or a bellows.

41. The ion pump of any of clauses 1-40, wherein the ion pump is connected to a charged-particle inspection apparatus.

42. The ion pump of any of clauses 1-41, wherein the ion pump is connected to a scanning electron microscope.

43. A charged-particle inspection system, comprising:
a charged-particle inspection apparatus; and
an ion pump of any of clauses 1-42, connected to a vessel of the charged-particle inspection apparatus for generating a vacuum in the vessel.

44. An ion pump, comprising:
a pump body comprising a wall, the wall comprising a first opening; and
an inlet pipe connected to the first opening, comprising:
a pipe portion having a first end portion secured to the first opening,
a flange portion having a second opening, wherein the flange portion is secured to a second end portion of the pipe portion, and
a damper attached to the flange portion opposite to the second end portion, configured to attenuate vibration energy.

45. The ion pump of clause 44, wherein the first end portion's outer surface is inside the first opening, and the first end portion is secured to the first opening on a side of the wall inside the pump body and on an outer surface of the first end portion outside the pump body.

46. The ion pump of clause 44, wherein the damper comprises one of an elastic component or a flexible component.

47. The ion pump of any of clauses 44-46, wherein the damper comprises one of a rubber or a bellows.

48. An ion pump, comprising:
a pump body comprising a wall, the wall comprising a first opening; and
an inlet pipe connected to the first opening, comprising:
a pipe portion having a first end portion secured to the first opening, and
a flange portion having a second opening, wherein the flange portion is secured to a second end portion of the pipe portion such that stiffness of connection of the flange portion and the second end portion is greater than or equal to 107 Newton Per Meter.

49. The ion pump of clause 48, wherein the first end portion's outer surface is inside the first opening, and the first end portion is secured to the first opening on a first side of the wall inside the pump body and on an outer surface of the first end portion outside the pump body.

50. The ion pump of clause 48, wherein the first end portion is secured to the first opening on a first side of the wall inside the pump body and on an outer surface of the first end portion outside the pump body.

51. The ion pump of any of clauses 48-50, further comprising:

a housing configured to hold the pump body; and a T-shape connector configured to secure the pump body to the housing.

52. The ion pump of clause 51, wherein the housing comprises a pole piece of a magnet set.

53. The ion pump of any of clauses 51-52, wherein the T-shape connector is further configured to bolt the pump body to the housing.

54. The ion pump of any of clauses 51-53, further comprising a plurality of T-shape connectors configured to secure the pump body to the housing.

55. The ion pump of any of clauses 51-54, wherein thickness of the T-shape connector is greater than or equal to 3 millimeters.

56. The ion pump of any of clauses 51-55, wherein thickness of the T-shape connector is greater than or equal to 9 millimeters.

57. The ion pump of any of clauses 50-56, wherein the first end portion is welded to the first opening on the first side of the wall inside the pump body and on the outer surface of the first end portion outside the pump body.

58. The ion pump of any of clauses 48-57, further comprising:

a feature configured to reinforce connection of the first end portion and the first opening, wherein the feature connects an outer surface of the first end portion to a second side of the wall outside the pump body such that stiffness of the connection of the first end portion and the first opening is greater than or equal to 107 Newton Per Meter.

59. The ion pump of any of clauses 48-58, wherein the second opening is further configured to be connected to a vessel, wherein the ion pump is configured to generate a vacuum in the vessel.

60. The ion pump of any of clauses 48-59, wherein the inlet pipe and the wall are manufactured as an inseparable part.

61. The ion pump of any of clauses 48-60, wherein the inlet pipe is welded to the wall.

62. The ion pump of any of clauses 48-61, wherein the inlet pipe and the wall are cast as a single part.

63. The ion pump of any of clauses 48-62, wherein the pipe portion and the flange portion are manufactured as an inseparable part.

64. The ion pump of any of clauses 48-63, wherein the flange portion is welded to the pipe portion.

65. The ion pump of any of clauses 48-64, wherein the flange portion and the pipe portion are cast as a single part.

66. The ion pump of any of clauses 48-65, wherein thickness of a wall of the pipe portion is greater than or equal to 1.6 millimeters.

67. The ion pump of any of clauses 48-66, wherein thickness of a wall of the pipe portion is greater than or equal to 3.1 millimeters.

68. The ion pump of any of clauses 48-67, wherein thickness of a wall of the pipe portion is greater than or equal to 4.6 millimeters.

69. The ion pump of any of clauses 48-68, wherein thickness of a wall of the pipe portion is greater than or equal to 7.1 millimeters.

70. The ion pump of any of clauses 48-69, wherein thickness of the wall is greater than or equal to 2.5 millimeters.

71. The ion pump of any of clauses 48-70, wherein thickness of the wall is greater than or equal to 5.5 millimeters.

72. The ion pump of any of clauses 48-71, wherein thickness of the wall is greater than or equal to 8.5 millimeters.

73. The ion pump of any of clauses 48-72, wherein thickness of the wall is greater than or equal to 13.5 millimeters.

74. The ion pump of any of clauses 58-73, wherein the feature comprises one of a fillet, a chamfer, a plate, or a rib.

75. The ion pump of any of clauses 58-74, wherein the feature is a plate having a thickness greater than or equal to 3 millimeters.

76. The ion pump of any of clauses 58-75, wherein the feature is a plate having a thickness greater than or equal to 6 millimeters.

77. The ion pump of any of clauses 58-76, wherein the feature is a plate having a thickness greater than or equal to 11 millimeters.

78. The ion pump of any of clauses 58-77, wherein the feature is welded to the outer surface of the first end portion and the second side of the wall outside the pump body.

79. The ion pump of any of clauses 58-78, wherein the pipe portion is cast to have the feature at the first end portion, and the feature is welded to the second side of the wall outside the pump body.

80. The ion pump of any of clauses 48-79, wherein a length of the pipe portion is shorter than or equal to 41 millimeters.

81. The ion pump of any of clauses 48-80, wherein a length of the pipe portion is shorter than or equal to 38 millimeters.

82. The ion pump of any of clauses 48-81, wherein a length of the pipe portion is shorter than or equal to 35 millimeters.

83. The ion pump of any of clauses 48-82, wherein a length of the pipe portion is shorter than or equal to 30 millimeters.

84. The ion pump of any of clauses 58-83, wherein a natural frequency of the ion pump is greater than or equal to 150 Hz when the stiffness of connection of the flange portion and the second end portion is greater than or equal to 107 Newton Per Meter and the stiffness of the connection of the first end portion and the first opening is greater than or equal to 107 Newton Per Meter.

85. The ion pump of clause 84, wherein the natural frequency of the ion pump is greater than or equal to 40 Hz.

86. The ion pump of clause 84, wherein the natural frequency of the ion pump is greater than or equal to 100 Hz.

87. The ion pump of clause 84, wherein the natural frequency of the ion pump is greater than or equal to 150 Hz.

88. The ion pump of clauses 84, wherein the natural frequency of the ion pump is greater than or equal to 200 Hz.

89. The ion pump of any of clauses 48-88, further comprising a damper attached to the flange portion opposite to the second end portion, configured to attenuate vibration energy.

90. The ion pump of clause 89, wherein the damper comprises one of an elastic component or a flexible component.

91. The ion pump of any of clauses 38-90, wherein the damper comprises one of a rubber or a bellows.

92. The ion pump of any of clauses 48-91, wherein the ion pump is connected to a charged-particle inspection apparatus.

93. The ion pump of any of clauses 48-92, wherein the ion pump is connected to a scanning electron microscope.

94. A charged-particle inspection system, comprising:
a charged-particle inspection apparatus; and
an ion pump of any of clauses 48-91, connected to a vessel of the charged-particle inspection apparatus for generating a vacuum in the vessel.

95. An ion pump, comprising:
a pump body comprising a wall;
a housing configured to hold the pump body;
a T-shape connector configured to secure the pump body to the housing, wherein
the wall comprises an inlet pipe portion extruding from the wall, the inlet pipe portion being cast with the wall as a single part,
the inlet pipe portion comprises a first opening enclosed by an inner surface of the inlet pipe portion,
the first opening connecting a space inside the inlet pipe portion and a space inside the wall, and
the inlet pipe portion comprises a flange-shape portion at an end of the inlet pipe portion.

96. A charged-particle inspection system, comprising:
a charged-particle inspection apparatus; and
an ion pump of clause 95, connected to a vessel of the charged-particle inspection apparatus for generating a vacuum in the vessel.

97. An ion pump, comprising:
a pump body comprising a wall, wherein
the wall comprises an inlet pipe portion extruding from the wall, the inlet pipe portion being cast with the wall as a single part,
the inlet pipe portion comprises a first opening enclosed by an inner surface of the inlet pipe portion,
the first opening connecting a space inside the inlet pipe portion and a space inside the wall, and
the inlet pipe portion comprises a flange-shape portion at an end of the inlet pipe portion.

98. The ion pump of clause 97, further comprising:
a housing configured to hold the pump body; and
a T-shape connector configured to secure the pump body to the housing.

99. The ion pump of any of clauses 97-98, further comprising a damper attached to the flange-shape portion, configured to attenuate vibration energy.

100. The ion pump of clause 99, wherein the damper comprises one of an elastic component or a flexible component.

101. The ion pump of any of clauses 99-100, wherein the damper comprises one of a rubber or a bellows.

102. The ion pump of any of clauses 99-101, wherein the ion pump is connected to a charged-particle inspection apparatus.

103. The ion pump of any of clauses 99-102, wherein the ion pump is connected to a scanning electron microscope.

104. A charged-particle inspection system, comprising:
a charged-particle inspection apparatus; and
an ion pump of any of clauses 97-101, connected to a vessel of the charged-particle inspection apparatus for generating a vacuum in the vessel.

105. A pump, comprising:
a pump body; and
a damping element coupled to the pump body, wherein the pump body and the damping element form
a mass-based damper, and wherein
the pump body forms a mass component of the mass-based damper; and
the damping element forms a damping component of the mass-based damper.

106. The pump of clause 105, wherein the pump is an ion pump.

107. The pump of any of clauses 105-106, wherein the damping element comprises one of rubber or viton.

108. The pump of any of clauses 105-107, wherein the pump is configured to be secured by a connector to a column of a charged-particle inspection apparatus for generating a vacuum in the column.

109. The pump of clause 108, wherein the connector and the damping element form an elastic component of the mass-based damper.

110. The pump of any of clauses 108-109, wherein the charged-particle inspection apparatus comprises a scanning electron microscope.

111. The pump of any of clauses 108-110, wherein the connector comprises a bolt.

112. The pump of any of clauses 108-111, the damping element is configured to attenuate an amplitude of a vibration of the column.

113. The pump of any of clauses 108-112, wherein the damping element has a damping ratio configured to depend on a ratio between a first mass of the column and a second mass of the pump.

114. The pump of any of clauses 108-113, wherein the mass-based damper is a tuned-mass damper.

115. The pump of clause 114, wherein the damping element is arranged between the pump body and the column.

116. The pump of any of clauses 108-113, wherein the mass-based damper is a skyhook damper.

117. The pump of clause 116, wherein the damping element is arranged between the pump body and a part of the charged-particle inspection apparatus other than the column.

118. The pump of any of clauses 108-113, wherein the mass-based damper is an active-mass damper, and wherein the pump further comprises:
a sensor coupled to the pump body;
an actuator coupled to the pump body; and
circuitry communicatively coupled to the sensor and the actuator, the circuitry being configured to:
receive, from the sensor, motion data indicative of a vibration of the column;
determine a damping for attenuating the amplitude of the vibration of the column based on the motion data and the damping ratio of the damping element; and
actuate the actuator to react to the vibration of the column in accordance with the damping.

119. A charged-particle inspection system, comprising:
a charged-particle inspection apparatus; and
a pump of any of clauses 105-118, secured to the column of the charged-particle inspection apparatus.

120. A pump, comprising:

a pump body configured to be secured to a column of a charged-particle inspection apparatus;

a sensor coupled to the pump body;

an actuator coupled to the pump body; and circuitry communicatively coupled to the sensor and the actuator, the circuitry being configured to:

receive, from the sensor, motion data indicative of a vibration of the column;

determine a damping for attenuating an amplitude of the vibration of the column based on the motion data; and actuate the actuator to react to the vibration of the column in accordance with the damping.

121. A charged-particle inspection system, comprising:

a charged-particle inspection apparatus; and a pump of clause 120, secured to the column of the charged-particle inspection apparatus.

122. A pump, comprising:

a pump body;

a sensor coupled to the pump body and configured to provide motion data indicative of a vibration to a controller; and an actuator coupled to the pump body and configured to acquire damping data from the controller for reacting to the vibration, wherein the damping data is based on the motion data.

It will be appreciated that the embodiments of the present disclosure are not limited to the exact construction that has been described above and illustrated in the accompanying drawings and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as examples only, with a true scope and spirit of the invention being indicated by the following clauses.

The invention claimed is:

1. An ion pump, comprising:

a pump body comprising a wall, the wall comprising a first opening; and an inlet pipe connected to the first opening, comprising:

a pipe portion having a first end portion secured to the first opening, and a flange portion having a second opening, wherein the flange portion is secured to a second end portion of the pipe portion such that stiffness of connection of the flange portion and the second end portion is greater than or equal to $10^7$ Newton Per Meter.

2. The ion pump of claim 1, wherein an outer surface of the first end portion is inside the first opening, and the first end portion is secured to the first opening on a first side of the wall inside the pump body and on an outer surface of the first end portion outside the pump body.

3. The ion pump of claim 1, wherein the first end portion is secured to the first opening on a first side of the wall inside the pump body and on an outer surface of the first end portion outside the pump body.

4. The ion pump of claim 1, further comprising:

a housing configured to hold the pump body; and a T-shape connector configured to secure the pump body to the housing.

5. The ion pump of claim 4, wherein the housing comprises a pole piece of a magnet set.

6. The ion pump of claim 4, wherein the T-shape connector is further configured to bolt the pump body to the housing.

7. The ion pump of claim 4, further comprising a plurality of T-shape connectors configured to secure the pump body to the housing.

8. The ion pump of claim 4, wherein thickness of the T-shape connector is greater than or equal to 3 millimeters.

9. The ion pump of claim 4, wherein thickness of the T-shape connector is greater than or equal to 9 millimeters.

10. The ion pump of claim 3, wherein the first end portion is welded to the first opening on the first side of the wall inside the pump body and on the outer surface of the first end portion outside the pump body.

11. The ion pump of claim 1, further comprising:

a feature configured to reinforce connection of the first end portion and the first opening, wherein the feature connects an outer surface of the first end portion to a second side of the wall outside the pump body such that stiffness of the connection of the first end portion and the first opening is greater than or equal to $10^7$ Newton Per Meter.

12. The ion pump of claim 1, wherein the second opening is further configured to be connected to a vessel, wherein the ion pump is configured to generate a vacuum in the vessel.

13. The ion pump of claim 1, wherein the inlet pipe and the wall are manufactured as an inseparable part.

14. The ion pump of claim 11, wherein a natural frequency of the ion pump is greater than or equal to 150 Hz when the stiffness of connection of the flange portion and the second end portion is greater than or equal to $10^7$ Newton Per Meter and the stiffness of the connection of the first end portion and the first opening is greater than or equal to $10^7$ Newton Per Meter.

15. A charged-particle inspection system, comprising:

a charged-particle inspection apparatus; and an ion pump of claim 1, connected to a vessel of the charged-particle inspection apparatus for generating a vacuum in the vessel.

* * * * *